(12) United States Patent
Fukushima

(10) Patent No.: US 6,656,810 B1
(45) Date of Patent: Dec. 2, 2003

(54) SEMICONDUCTOR DEVICE CAPABLE OF REDUCING DISPERSION IN ELECTRICAL CHARACTERISTICS AND OPERATING AT HIGH SPEED AND METHOD FOR FABRICATING THE SAME

(75) Inventor: Yasumori Fukushima, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/705,815

(22) Filed: Nov. 6, 2000

Related U.S. Application Data

(62) Division of application No. 09/427,638, filed on Oct. 27, 1999.

(30) Foreign Application Priority Data

Oct. 30, 1998 (JP) .......................................... 10-310233

(51) Int. Cl.[7] .................. H01L 21/331; H01L 21/8221; H01L 21/8222; H01L 21/3205
(52) U.S. Cl. ...................... 438/320; 438/332; 438/337; 438/339; 438/589
(58) Field of Search ................................. 438/163, 332, 438/589, 320, 142, 197, 151, 337, 270, 282, 149, 622, 631, 311

(56) References Cited

U.S. PATENT DOCUMENTS

| 5,567,966 A | | 10/1996 | Hwang | |
|---|---|---|---|---|
| 5,956,580 A | * | 9/1999 | Wu | 438/163 |
| 6,060,749 A | * | 5/2000 | Wu | 257/347 |
| 6,117,712 A | * | 9/2000 | Wu | 438/163 |
| 6,140,219 A | * | 10/2000 | Dennison | 438/618 |

FOREIGN PATENT DOCUMENTS

| JP | 5-326961 | 12/1993 |
|---|---|---|
| JP | 7-142739 | 6/1995 |
| JP | 9-8308 | 1/1997 |
| KR | 96-43294 | 12/1996 |

OTHER PUBLICATIONS

Korean Office Action (Aug. 31, 2001).
U.S. patent application Ser. No. 09/427,638, filed Oct. 27, 1999.

* cited by examiner

Primary Examiner—Wael Fahmy, Jr.
Assistant Examiner—Shrinivas H. Rao
(74) Attorney, Agent, or Firm—Nixon & Vanderhye P.C.

(57) ABSTRACT

There is provided a semiconductor device capable of reducing dispersion in electrical characteristics, preventing occurrence of bridge shortcircuit in a silicide process and operating at high operating speed and method for fabricating the same. In a SOI substrate obtained by forming an insulating layer 2 and a SOI layer 3 on a silicon substrate 1, there are formed a channel region 19, an LDD region 15a and source and drain junction regions 17 and 18 in the SOI layer 3. A gate electrode 14 whose both side walls have a shape roughly perpendicular to the SOI substrate is formed via a gate insulating film on the channel region 19. An oxide film spacer 16 is formed on the LDD region 15a on both side wall sides of the gate electrode 14. The source and drain junction regions 17 and 18 have a thickness greater than that of the channel region 19, and the thickness of the LDD region 15a continuously varies so that the thickness gradually increases from the channel region 19 side toward the source junction region 17 side and the drain junction region 18 side.

13 Claims, 14 Drawing Sheets

SEMICONDUCTOR DEVICE CAPABLE OF REDUCING DISPERSION IN ELECTRICAL CHARACTERISTICS AND OPERATING AT HIGH SPEED AND METHOD FOR FABRICATING THE SAME

This is a divisional of application Ser. No. 09/427,638, filed Oct. 27, 1999, the entire content of which is hereby incorporated by reference in this application.

BACKGROUND OF THE INVENTION

The present invention relates to a semiconductor device such as a MOS (Metal Oxide Semiconductor) transistor having a recess structure formed on a SOI (Semiconductor on Insulator) substrate and method for fabricating the same.

A transistor formed by using a SOI substrate is attracting attention as a device having the superior electrical characteristics of a low threshold voltage, a good sub-threshold characteristic, absence of parasitic bipolar effect and so on as compared with the conventional transistor formed by using a bulk semiconductor substrate, and accordingly, researches on the transistor are being energetically conducted.

The SOI substrate has a structure in which an insulating layer is formed on a silicon substrate and a silicon layer (referred to as a SOI layer hereinafter) is formed on the insulating layer. A MOS transistor formed on such a SOI substrate generally has a structure as shown in FIG. 11. in regard to the SOI wafer where an insulating layer 102 and a SOI layer 103 are formed on a silicon substrate 101, a gate electrode 114 is formed on the SOI layer 103 via a gate oxide film 112, and thereafter, low-concentration impurity ions are implanted using the gate electrode 114 as a mask to form LDD (lightly doped drain) regions 115 and 115 on both sides of a channel region 119. Further, oxide film spacers 116 and 116 are formed on the side wall sides of the gate electrode 114, and thereafter, high-concentration ion implantation is executed using the gate electrode 114 and the oxide film spacers 116 and 116 as a mask to form a source junction region 117 and a drain junction region 118. In the thus-formed MOS transistor, the channel region 119 is formed with a small thickness of 50 to 150 nm in order to improve the carrier mobility, and therefore, the source junction region 117 and the drain junction region 118 are similarly reduced in thickness. As a result, the resistances of the source junction region 117 and the drain junction region 118 themselves increase, and this leads to the problem that the operating speed of the MOS transistor is reduced to degrade the device characteristics.

In order to solve the above problems, the following semiconductor device fabricating methods (1) and (2) have conventionally been proposed.

(1) The Semiconductor Device Fabricating Method Disclosed in the Prior Art Reference of Japanese Patent Laid-Open Publication No. HEI 9-8308

FIGS. 12A through 12E are process charts for explaining the semiconductor device fabricating method disclosed in the prior art reference of Japanese Patent Laid-Open Publication No. HEI 9-8308. In the SOI substrate constructed of a silicon substrate 201, an insulating layer 202 and a SOI layer 203, the thickness of the SOI layer 203 is made to have a thickness of 300 to 500 nm. The SOI layer of a portion where a channel region and an LDD region are formed is etched using a photosensitive film 222 as a mask to reduce the film thickness of the portion of the SOI layer 203 to a specified thickness, forming a trench 223 (FIG. 12A). Subsequently, a gate oxide film 212 and a polysilicon layer 213 are deposited on the entire SOI substrate. The polysilicon layer 213 and the gate oxide film 212 are successively etched using a photosensitive film 224 as a mask, and thereafter, the gate oxide film 212 and a gate electrode 214 are formed (FIGS. 12B and 12C). Subsequently, low-concentration impurity ions are implanted into the SOI layer 203 using the gate electrode 214 as a mask, forming an LDD region 215 (FIG. 12D). Subsequently, oxide film spacers 216 and 216 are formed on both side wall sides of the gate electrode 214, and finally high-concentration impurity ions are implanted using the gate electrode 214 and the oxide film spacers 216 as a mask, forming a source junction region 217 and a drain junction region 218 (FIG. 12E).

(2) A Semiconductor Device Fabricating Method Using a LOCOS (Local Oxidation of Silicon) Process FIGS. 14A through 14D are process charts for explaining a semiconductor device fabricating method using a LOCOS process. First of all, as shown in FIGS. 14A and 14B, in the SOI substrate constructed of a silicon substrate 401, an insulating layer 402 and a SOI layer 403, the channel region is subjected to the LOCOS process, and thereafter, the resulting LOCOS oxide film is totally removed using a nitride film 405 as a mask, forming a recess. Subsequently, as shown in FIG. 14C, a gate oxide film 412 is formed, and thereafter, a polysilicon film 413 is deposited by the CVD (Chemical Vapor Deposition) method on the entire SOI substrate. Subsequently, the polysilicon film 413 is etched back to the surface of the nitride film 405 to form a gate electrode 414. The nitride film is removed, and thereafter, a source junction region and a drain junction region are formed in the SOI layer 403 in a self-alignment manner using the gate electrode 414 as a mask.

In each of the transistors formed on the SOI layers fabricated by the prior art techniques shown in FIGS. 12A through 12E and FIGS. 14A through 14D, the portion where the channel region or the LDD region is formed is set at a specified depth, and the source junction region and the drain junction region can be made thick. Therefore, the transistors have the effect of reducing the resistances of the junction regions.

However, the transistors formed on the SOI layers fabricated by the semiconductor device fabricating method shown in FIGS. 12A through 12E and FIGS. 14A through 14D have the problems as follows.

The semiconductor device fabricating method (1) has the following problem.

According to the semiconductor device fabricating method shown in FIGS. 12A through 12E, the gate electrode 214 is formed by etching with the photosensitive film 224 used as a mask. The position of the photosensitive film 224 that serves as the mask formed through the processes of coating, exposure and developing varies within the range of accuracy of the exposure apparatus. Therefore, the photosensitive film 224 that serves as the mask can not always be formed at the center of the trench region 223.

FIGS. 13A through 13D are process charts when the position of the photosensitive film that serves as the mask is displaced. As shown in FIG. 13A, when a photosensitive film 324 is displaced from the center of the trench toward the source region side (leftward in FIGS. 3A through 3D), then a gate electrode 314 is formed (FIG. 13B). As a result, in the next process for implanting low-concentration impurity ions into the LDD region, there is the structure in which an LDD region 315a located on the source side and an LDD region 315b located on the drain side become asymmetrical (FIG. 13C). Next, when high-concentration impurity ions are implanted into a source junction region 317 and a drain junction region 318, then the transistor comes to have a structure in which the source side and the drain side become asymmetrical about a channel region 319 (FIG. 13D). The degree of asymmetry depends on the accuracy of the exposure apparatus, and the gate electrode cannot always be formed at the center of the trench region. For this reason, it is very difficult to form the gate electrode in the specified position with high reproducibility, and this consequently leads to the problem that the resulting transistors significantly vary in electrical characteristics.

As countermeasures against the above problem, when the trench width is increased so that the LDD regions become equivalent to each other on the source side and the drain side as shown in FIG. 13E, then the size of the transistor increases, resulting in a disadvantage in terms of integration. Furthermore, since a source junction region 325 and a drain junction region 326 located outside the LDD regions 315a and 315b are reduced in thickness, and therefore, the junction regions come to have a great resistance to reduce the operating speed of the transistor.

The semiconductor device fabricating method (2) has the following problem.

According to the semiconductor device fabricating method shown in FIGS. 14A through 14D, a LOCOS oxide film 404 for forming a recess structure is totally removed by wet etching (FIG. 14B), and thereafter, the gate oxide film 412 and the gate electrode 414 are formed. As a result, the gate electrode 414 comes to have a structure in which the gate electrode 414 overlaps the LOCOS end of the SOI layer 403 (FIG. 14D), and this leads to the problem that a leak current attributed to the crystal defect is generated at the LOCOS end of the SOI layer 403.

Furthermore, the side wall shape of the gate electrode 414 becomes a bird's beak shape that is hard to be controlled, and this makes it difficult to control the implantation of impurities into the source junction region, the drain junction region and the channel region. As a result, the desired transistor structure cannot be obtained, and this causes the problem that the stable characteristics cannot be obtained.

Furthermore, according to the silicide technology for forming a low-resistance silicide on the surfaces of the gate electrode 414 or the source junction region and the drain junction region of the SOI layer 403, the gate electrode 414 has the structure in which the electrode 414 overlaps the LOCOS end of the SOI layer 403. Therefore, it is sometimes the case where a bridge shortcircuit might occur due to the silicide formation between the gate electrode 414 and the source junction region and drain junction region of the SOI layer 403.

SUMMARY OF THE INVENTION

Accordingly, the object of the present invention is to provide a semiconductor device capable of reducing the dispersion in electrical characteristics, preventing the occurrence of bridge shortcircuit in the silicide process and operating at high operating speed and method for fabricating the same.

In order to achieve the above object, the present invention provides a semiconductor device having a silicon substrate, an insulating layer formed on the silicon substrate and a SOI layer formed on the insulating layer, comprising:

a channel region formed in the SOI layer;
LDD regions formed on both sides of the channel region of the SOI layer;
a source junction region and a drain junction region formed outside the respective LDD regions of the SOI layer;
a gate electrode which is formed above the channel region via a gate insulating film and both side walls of which have a shape roughly perpendicular to the SOI substrate; and
an oxide film spacer formed on the LDD regions on both side wall sides of the gate electrode, wherein
the source junction region and the drain junction region have a thickness greater than that of the channel region and wherein
the LDD regions have a thickness continuously varying so that the LDD regions become gradually thicker from the channel region side toward the source junction region side and the drain junction region side.

According to the semiconductor device having the above construction, the structure provided with the oxide film spacer that is formed on the LDD regions on both side wall sides of the gate electrode on the channel region comes to have a self-alignment arrangement by using the gate electrode and the oxide film spacer as a mask in the process for implanting impurity ions in the fabricating stage, by which the position of the gate electrode is determined with respect to the positions of the source junction region and the drain junction region outside the LDD region. Therefore, the dispersion in electrical characteristics can be reduced. The source junction region and drain junction region of the SOI layer are made thicker than the channel region, and therefore, the resistances of the source and drain junction regions themselves are reduced. The LDD regions of the SOI layer continuously vary in thickness so that the thickness of the LDD regions gradually increases from the channel region thickness from the channel region side toward the source junction region side and the drain junction region side. Therefore, the increase of capacity between the gate electrode and the LDD region and that between the gate electrode and the source and drain junction regions are restrained. As described above, the operating speed of the transistor can be significantly improved by reducing the resistances of the source and drain junction regions themselves and restraining the increase in capacity between the gate electrode and the source and drain junction regions. Furthermore, the side wall shape of the gate electrode is formed roughly perpendicularly to the SOI substrate, and therefore, the gate electrode does not overlap the source and drain junction regions. In the case where the silicide process is applied, the bridge shortcircuit between the gate electrode and the source and drain junction regions can be prevented.

The present invention also provides a semiconductor device fabricating method comprising the steps of:

successively forming a first oxide film and a nitride film on a SOI substrate constructed of a silicon substrate, an insulating layer and a SOI layer;
forming an opening in the nitride film by removing the nitride film on a portion that becomes a channel region of the SOI layer;
selectively oxidizing the SOI layer and forming a selection oxide film on the remained SOI layer so that a portion that becomes a channel region of the remained SOI layer comes to have a specified thickness, wherein the nitride film in which the opening is formed is used as a mask;
etching the selection oxide film roughly perpendicularly to the SOI substrate until the remained SOI layer is exposed with the nitride film in which the opening is formed used as a mask after the formation of the selection oxide film;
forming a gate oxide film on the remained SOI layer exposed by etching the selection oxide film;

forming a gate electrode made of polysilicon inside the opening of the nitride film by forming a polysilicon layer on the entire SOI substrate on part of which the gate oxide film is formed and etching back the polysilicon layer;

forming a portion that becomes an LDD region in the SOI layer outside a region below the gate electrode by removing the nitride film, the selection oxide film and the first oxide film after the formation of the gate electrode and implanting low-concentration impurity ions into the SOI layer using the gate electrode as a mask;

forming an oxide film spacer on both side wall sides of the gate electrode by forming a second oxide film on the entire SOI substrate where the portion that becomes the LDD region is formed in the SOI layer and subjecting the second oxide film to anisotropic etching; and forming a source junction region and a drain junction region in the SOI layer outside the region below the gate electrode and the oxide film spacer by implanting high-concentration impurity ions into the SOI layer using the gate electrode and the oxide film spacer as a mask after the formation of the oxide film spacer.

According to the semiconductor device fabricating method of the present invention, the first oxide film and the nitride film are firstly successively formed on the SOI substrate constructed of tho silicon substrate, the insulating layer and the SOI layer, and the opening is formed in the nitride film by removing the nitride film on the portion that becomes the channel region of the SOI layer. Next, the SOI layer is selectively oxidized with the nitride film in which the opening is formed used as a mask so that the portion that becomes the channel region of the SOI layer comes to have the specified thickness, forming on the SOI layer the selection oxide film having the bird's beak shape of which the sectional shape gradually reduces in thickness toward the outside on both sides. Then, the SOI layer continuously varies in thickness along the bird's beak shape of the selection oxide film so that the portion (that becomes the channel region) below the opening of the nitride film becomes flat and both sides of the flat portion become gradually thicker toward the outside. Thereafter, by etching the selection oxide film roughly perpendicularly to the SOI substrate with the nitride film in which the opening is formed used as a mask, the portion that becomes the channel region of the SOI layer below the opening of the nitride film is exposed. Then, by forming the gate oxide film on the SOI layer exposed by the etching of the selection oxide film, forming the polysilicon layer on the entire SOI substrate where the gate oxide film is formed and etching back the polysilicon layer, the gate electrode made of polysilicon is formed inside the opening of the nitride film, i.e., on the portion that becomes the channel region of reduced film thickness of the SOI layer. By removing the nitride film, the selection oxide film and the first oxide film after the formation of the gate electrode and implanting low-concentration impurity ions into the SOI layer using the gate electrode as a mask, the portion that becomes the LDD region is formed in the SOI layer outside the region below the gate electrode. Then, by forming the second oxide film on the entire SOI substrate where the portion that becomes the LDD region is formed in the SOI layer and subjecting the second oxide film to anisotropic etching, the oxide film spacer is formed on both side wall sides of the gate electrode. Thereafter, by implanting high-concentration impurity ions into the SOI layer using the gate electrode and the oxide film spacer as a mask, the source junction region and the drain junction region are formed in the SOI layer outside the region below the gate electrode and the oxide film spacer. In this stage, the SOI layer below the oxide film spacer has its impurity concentration maintained low to become the LDD region. By forming the oxide film spacer on the portion where the SOI layer thickness continuously varies, the LDD region continuously varies in thickness so that its thickness gradually increases from the channel region side toward the source junction region side and the drain junction region side. In the semiconductor device fabricated as above, the position of the gate electrode is determined with respect to the positions of the source junction region and the drain junction region outside the LDD region. Therefore, the dispersion in electrical characteristics can be reduced. The source junction region and drain junction region of the SOI layer are made thicker than the channel region. Therefore, the resistances of the source and drain junction regions themselves are reduced. The LDD region of the SOI layer continuously varies in thickness so that its thickness gradually increases from the channel region thickness from the channel region side toward the source junction region side and the drain junction region side. Therefore, the increase of capacity between the gate electrode and the LDD region and of capacity between the gate electrode and the source and drain junction regions are restrained, allowing the operating speed of the transistor to be significantly improved. Furthermore, the side wall shape of the gate electrode is formed roughly perpendicularly to the SOI substrate, and therefore, the gate electrode does not overlap the source and drain junction regions. In the case where the silicide process is applied, the bridge shortcircuit between the gate electrode and the source and drain junction regions can be prevented.

The present invention also provides a semiconductor device having a silicon substrate, an insulating layer formed on the silicon substrate and a SOI layer formed on the insulating layer, comprising:

a channel region formed in the SOI layer;

LDD regions formed on both sides of a channel region of the SOI layer;

a source junction region and a drain junction region formed outside the respective LDD regions of the SOI layer;

a gate electrode which is formed on the channel region via a gate insulating film and both the side walls of which have a shape roughly perpendicular to the SOI substrate; and an oxide film spacer formed on the LDD regions on both side wall sides of the gate electrode, wherein the source junction region and the drain junction region have a thickness greater than each of those of the channel region and the LDD region and wherein the source junction region and the drain junction region continuously vary in thickness so that regions in the vicinity of the LDD region have a thickness that becomes gradually thicker from the LDD region side toward the outside.

According to the semiconductor device having the above construction, the structure provided with the oxide film spacer that is formed on the LDD regions on both side wall sides of the gate electrode on the channel region comes to have a self-alignment arrangement by using the gate electrode and the oxide film spacer as a mask in the process for implanting impurity ions in the fabricating stage, by which the position of the gate electrode is determined with respect to the positions of the source junction region and the drain junction region outside the LDD region. Therefore, the dispersion in electrical characteristics can be reduced. The source junction region and drain junction region of the SOI layer are made thicker than the channel region and the LDD region, by which the resistances of the source and drain junction regions themselves are reduced. The source junction region and the drain junction region continuously vary in thickness so that the regions in the vicinity of the LDD region have a thickness that becomes gradually thicker from the LDD region side toward the outside. Therefore, the increase of capacity between the gate electrode and the LDD region and of capacity between the gate electrode and the source and drain junction regions are restrained. As described above, the operating speed of the transistor can be significantly improved by reducing the resistances of the source and drain junction regions themselves and restraining the increase of capacity between the gate electrode and the source and drain junction regions. Furthermore, the side wall shape of the gate electrode is formed roughly perpendicularly to the SOI substrate, and therefore, the gate electrode does not overlap the source and drain junction regions. In the case where the silicide process is applied, the bridge short-circuit between the gate electrode and the source and drain junction regions can be prevented.

The present invention also provides a semiconductor device fabricating method comprising the steps of:

successively forming a first oxide film and a first nitride film on a SOI substrate constructed of a silicon substrate, an insulating layer and a SOI layer;

forming an opening in the first nitride film by removing a specified region of the first nitride film;

selectively oxidizing the SOI layer and forming a selection oxide film on the remained SOI layer so that a portion that becomes a channel region of the remained SOI layer comes to have a specified thickness, wherein the nitride film in which the opening is formed is used as a mask;

forming a nitride film spacer on both side wall sides of the opening of the first nitride film by forming a second nitride film on the entire SOI substrate where the selection oxide film is formed and etching back the second nitride film by anisotropic etching until the selection oxide film is exposed;

etching the selection oxide film roughly perpendicularly to the SOI substrate until the remained SOI layer is exposed using the first nitride film and the nitride film spacer as a mask after the formation of the nitride film spacer;

forming a gate oxide film on the remained SOI layer exposed by etching the selection oxide film;

forming a gate electrode made of polysilicon inside the opening of the first nitride film by forming a polysilicon layer on the entire SOI substrate on which the gate oxide film is formed and etching back the polysilicon layer;

forming a portion that becomes an LDD region in the SOI layer outside a region below the gate electrode by removing the first nitride film, the nitride film spacer, the selection oxide film and the first oxide film after the formation of the gate electrode and implanting low-concentration impurity ions into the SOI layer using the gate electrode as a mask;

forming an oxide film spacer on both side wall sides of the gate electrode by forming a second oxide film on the entire SOI substrate where the portion that becomes the LDD region is formed in the SOI layer and subjecting the second oxide film to anisotropic etching; and forming a source junction region and a drain junction region in the SOI layer outside the region below the gate electrode and the oxide film spacer by implanting high-concentration impurity ions into the SOI layer using the gate electrode and the oxide film spacer as a mask after the formation of the oxide film spacer.

According to the semiconductor device fabricating method of the present invention, the first oxide film and the first nitride film are firstly successively formed on the SOI substrate constructed of the silicon substrate, the insulating layer and the SOI layer, and the opening is formed in the first nitride film by removing the specified region of the first nitride film. Next, the SOI layer is selectively oxidized with the first nitride film in which the opening is formed used as a mask so that the portion that becomes the channel region of the SOI layer comes to have the specified thickness, forming on the SOI layer the selection oxide film having the bird's beak shape of which the sectional shape gradually reduces in thickness toward the outside on both sides. Then, the SOI layer continuously varies in thickness along the bird's beak shape of the selection oxide film so that the portion below the opening of the nitride film becomes flat and both sides of the flat portion become gradually thicker toward the outside. Thereafter, by forming the second nitride film on the entire SOI substrate where the selection oxide film is formed and etching back the second nitride film. by anisotropic etching until the selection oxide film is exposed, the nitride film spacer is formed on both side wall sides of the opening of the first nitride film. Thereafter, by etching the selection oxide film roughly perpendicularly to the SOI substrate until the SOI layer is exposed using the first nitride film and the nitride film spacer as a mask, the portion of the SOI layer below the opening of the first nitride film is exposed except for the region below the nitride film spacer. Then, by forming the gate oxide film on the SOI layer exposed by the etching of the selection oxide film, forming the polysilicon layer on the entire SOI substrate where the gate oxide film is formed and etching back the polysilicon layer, the gate electrode made of polysilicon is formed inside the opening of the first nitride film. By removing the first nitride film, the nitride film spacer, the selection oxide film and the first oxide film after the formation of the gate electrode and implanting low-concentration impurity ions into the SOI layer using the gate electrode as a mask, the portion that becomes the LDD region is formed in the SOI layer outside the region below the gate electrode. Then, by forming the second oxide film on the entire SOI substrate where the portion that becomes the LDD region is formed in the SOI layer and subjecting the second oxide film to anisotropic etching, the oxide film spacer is formed on both side wall sides of the gate electrode. Thereafter, by implanting high-concentration impurity ions into the SOI layer using the gate electrode and the oxide film spacer as a mask, the source junction region and the drain junction region are formed in the SOI layer outside the region below the gate electrode and the oxide film spacer. In this stage, the SOI layer below the oxide film spacer has its impurity concentration maintained low to become the LDD region. By forming the oxide film spacer on the flat portion of reduced film thickness of the SOI layer, the LDD region comes to have the same thickness as that of the channel region, while the source junction region and the drain junction region continuously vary in thickness go that the regions in the vicinity of the LDD region have a thickness that becomes gradually thicker from the LDD region side toward the outside. In the semiconductor device fabricated as above, the position of the gate electrode is determined with respect to the positions of the source junction region and the drain junction region outside the LDD region. Therefore, the dispersion in electrical characteristics can be reduced. The source junction region and drain junction region of the SOI layer are made thicker than the channel region. Therefore, the resistances of the source and drain junction regions themselves are reduced. The LDD region of the SOI layer comes to have the same thickness as that of the channel region having a small film thickness, and therefore, the increase of capacity between the gate electrode and the LDD region and that between the gate electrode and the source and drain junction regions are restrained, allowing the operating speed of the transistor to be significantly improved. Furthermore, the side wall shape of the gate electrode is formed roughly perpendicularly to the SOI substrate, and therefore, the gate electrode does not overlap the source and drain junction regions. In the case where the silicide process is applied, the bridge shortcircuit between the gate electrode and the source and drain junction regions can be prevented.

The present invention also provides a semiconductor device fabricating method comprising the steps of:

successively forming a first oxide film and a first nitride film on a SOI substrate constructed of a silicon substrate, an insulating layer and a SOI layer;

forming an opening in the first nitride film by removing a specified region of the first nitride film;

selectively oxidizing the SOI layer and forming a selection oxide film on the remained SOI layer so that a portion that becomes a channel region of the remained SOI layer comes to have a specified thickness, wherein the nitride film in which the opening is formed is used as a mask;

etching the selection oxide film roughly perpendicularly to the SOI substrate until the remained SOI layer is exposed with the first nitride film in which the opening is formed used as a mask after the formation of the selection oxide film;

forming a second oxide film on the remained SOI layer exposed by etching the selection oxide film;

forming a nitride film spacer on both side wall sides of the opening of the first nitride film by forming a second nitride film on the entire SOI substrate on which the second oxide film is formed and etching back the second nitride film by anisotropic etching until the second oxide film is exposed;

removing the exposed, region of the second oxide film after the formation of the nitride film spacer and forming a gate oxide film on the SOI layer exposed by the removal of the second oxide film;

forming a gate electrode made of polysilicon inside the opening of the first nitride film by forming a polysilicon layer on the entire SOI substrate on part of which the gate oxide film is formed and etching back the polysilicon layer;

forming a portion that becomes an LDD region in the SOI layer outside a region below the gate electrode by removing the first nitride film, the nitride film spacer, the selection oxide film and the first oxide film after the formation of the gate electrode and implanting low-concentration impurity ions into the SOI layer using the gate electrode as a mask;

forming an oxide film spacer on both side wall sides of the gate electrode by forming a second oxide film on the entire SOI substrate where the portion that becomes the LDD region is formed in the SOI layer and subjecting the second oxide film to anisotropic etching; and forming a source junction region and a drain junction region in the SOI layer outside the region below the gate electrode and the oxide film spacer by implanting high-concentration impurity ions into the SOI layer using the gate electrode and the oxide film spacer as a mask after the formation of the oxide film spacer.

According to the semiconductor device fabricating method of the present invention, the first oxide film and the first nitride film are firstly successively formed on the SOI substrate constructed of the silicon substrate, the insulating layer and the SOI layer, and the opening is formed in the first nitride film by removing the specified region of the first nitride film. Next, the SOI layer is selectively oxidized with the first nitride film in which the opening is formed used as a mask so that the portion that becomes the channel region of the SOI layer comes to have the specified thickness, forming on the SOI layer the selection oxide film having the bird's beak shape of which the sectional shape gradually reduces in thickness toward the outside on both sides. Then, the SOI layer continuously varies in thickness along the bird's beak shape of the selection oxide film so that the portion below the opening of the first nitride film becomes flat and both sides of the flat portion become gradually thicker toward the outside. Thereafter, by etching the selection oxide film roughly perpendicularly to the SOI substrate with the first nitride film in which the opening is formed used as a mask, the portion of the SOI layer below the opening of the first nitride film is exposed. Then, by forming the second oxide film on the SOI layer exposed by the etching of the selection oxide film, forming the second nitride film on the entire SOI substrate on which the second oxide film has been formed and etching back the second nitride film by anisotropic etching until the second oxide film is exposed, the nitride film spacer is formed on both side wall sides of the opening of the first nitride film. By removing the exposed region of the second oxide film after the formation of the nitride film spacer, forming the gate oxide film on the SOI layer exposed by the removal of the second oxide film, forming the polysilicon layer on the entire SOI substrate where the gate oxide film is formed and etching back the polysilicon layer, the gate electrode made of polysilicon is formed inside the opening of the first nitride film. By removing the first nitride film, the nitride film spacer, the selection oxide film and the first oxide film after the formation of the gate electrode and implanting low-concentration impurity ions into the SOI layer using the gate electrode as a mask, the portion that becomes the LDD region is formed in the SOI layer outside the region below the gate electrode. Then, by forming the second oxide film on the entire SOI substrate where the portion that becomes the LDD region is formed in the SOI layer and subjecting the second oxide film to anisotropic etching, the oxide film spacer is formed on both side wall sides of the gate electrode. Thereafter, by implanting high-concentration impurity ions into the SOI layer using the gate electrode and the oxide film spacer as a mask, the source junction region and the drain junction region are formed in the SOI layer outside the region below the gate electrode and the oxide film spacer. In this stage, the SOI layer below the oxide film spacer has its impurity concentration maintained low to become the LDD region. By forming the oxide film spacer on the flat portion of reduced film thickness of the SOI layer, the LDD region comes to have the same thickness as that of the channel region, while the source junction region and the drain junction region continuously vary in thickness so that the regions in the vicinity of the LDD region have a thickness that becomes gradually thicker from the LDD region side toward the outside. In the semiconductor device fabricated as above, the position of the gate electrode is determined with respect to the positions of the source junction region and the drain junction region outside the LDD region. Therefore, the dispersion in electrical characteristics can be reduced. The source junction region and drain junction region of the SOI layer are made thicker than the channel region. Therefore, the resistances of the source and drain junction regions themselves are reduced. The LDD region of the SOI layer comes to have the same thickness as that of the channel region having a small film thickness, and therefore, the increase of capacity between the gate electrode and the LDD region and that between the gate electrode and the source and drain junction regions are restrained, allowing the operating speed of the transistor to be significantly improved. Furthermore, the side wall shape of the gate electrode is formed roughly perpendicularly to the SOI substrate, and therefore, the gate electrode. does not overlap the source and drain junction regions. In the case where the silicide process is applied, the bridge shortcircuit between the gate electrode and the source and drain junction regions can be prevented.

The present invention also provides a semiconductor device fabricating method comprising the steps of:

successively forming a first oxide film and a first nitride film on a SOI substrate constructed of a silicon substrate, an insulating layer and a SOI layer;

forming an opening in the first nitride film by removing a specified region of the first nitride film;

selectively oxidizing the SOI layer and forming a selection oxide film on the remained SOI layer so that a portion that becomes a channel region of the remained SOI layer comes to have a specified thickness, wherein the nitride film in which the opening is formed is used as a mask;

forming a first nitride film spacer on both side wall sides of the opening of the first nitride film by forming a second nitride film on the entire SOI substrate where the selection oxide film is formed and etching back the second nitride film by anisotropic etching until the selection oxide film is exposed;

etching the selection oxide film roughly perpendicularly to the SOI substrate until the SOI layer is exposed using the first nitride film and the first nitride film spacer as a mask after the formation of the first nitride film spacer;

forming a second oxide film on the SOI layer exposed by etching the selection oxide film;

forming a second nitride film spacer on both side wall sides of the first nitride film spacer in the opening of the first nitride film by forming a third nitride film on the entire SOI substrate after the formation of the second oxide film and etching back the third nitride film by anisotropic etching until the second oxide film is exposed;

removing the exposed region of the second oxide film after the formation of the second nitride film spacer and forming a gate oxide film on the SOI layer exposed by the removal of the second oxide film;

forming a gate electrode made of polysilicon inside the opening of the first nitride film by forming a polysilicon layer on the entire SOI substrate where the gate oxide film is formed and etching back the polysilicon layer;

forming a portion that becomes an LDD region in the SOI layer outside a region below the gate electrode by removing the first nitride film, the first nitride film spacer, the second nitride film spacer, the selection oxide film and the first oxide film after the formation of the gate oxide film and implanting low-concentration impurity ions into the SOI layer using the gate electrode as a mask;

forming an oxide film spacer on both side wall sides of the gate electrode on a portion that becomes the LDD region of the SOI layer by forming a second oxide film on the entire SOI substrate where the portion that becomes the LDD region is formed in the SOI layer and subjecting the second oxide film to anisotropic etching; and forming a source junction region and a drain junction region in the SOI layer outside the region below the gate electrode and the oxide film spacer by implanting high-concentration impurity ions into the SOI layer using the gate electrode and the oxide film spacer as a mask after the formation of the oxide film spacer.

According to the semiconductor device fabricating method of the present invention, the first oxide film and the first nitride film are firstly successively formed on the SOI substrate constructed of the silicon substrate, the insulating layer and the SOI layer, and the opening is formed in the first nitride film by removing the specified region of the first nitride film. Next, the SOI layer is selectively oxidized with the first nitride film in which the opening is formed used as a mask so that the portion that becomes the channel region of the SOI layer comes to have the specified thickness, forming on the SOI layer the selection oxide film having the bird's beak shape of which the sectional shape gradually reduces in thickness toward the outside on both sides. Then, the SOI layer continuously varies in thickness along the bird's beak shape of the selection oxide film so that the portion below the opening of the first nitride film becomes flat and both sides of the flat portion become gradually thicker toward the outside. Thereafter, by forming the second nitride film on the entire SOI substrate where the selection oxide film is formed and etching back the second nitride film by anisotropic etching until the selection oxide film is exposed, the first nitride film spacer is formed on both side wall sides of the opening of the first nitride film. Then, by etching the selection oxide film roughly perpendicularly to the SOI substrate using the first nitride film and the first nitride film spacer as a mask after the formation of the first nitride film spacer, the portion of the SOI layer below the opening of the first nitride film is exposed except for the region below the first nitride film spacer. Then, by forming a second oxide film on the SOI layer exposed by the etching of the selection oxide film, thereafter forming the third nitride film on the entire SOI substrate and etching back the third nitride film by anisotropic etching until the second oxide film is exposed, the second nitride film spacer is formed on both side wall sides of the first nitride film spacer in the opening of the first nitride film. By removing the exposed region of the second oxide film after the formation of the second nitride film spacer, forming the gate oxide film on the SOI layer exposed by the removal of the second oxide film, forming the polysilicon layer on the entire SOI substrate where the gate oxide film is formed and etching back the polysilicon layer, the gate electrode made of polysilicon is formed inside the opening of the first nitride film. By removing the first nitride film, the first nitride film spacer, the second nitride film spacer, the selection oxide film and the first oxide film after the formation of the gate oxide film and implanting low-concentration impurity ions into the SOI layer using the gate electrode as a mask, the portion that becomes the LDD region is formed in the SOI layer outside the region below the gate electrode. Then, by forming the second oxide film on the entire SOI substrate where the portion that becomes the LDD region is formed in the SOI layer and subjecting the second oxide film to anisotropic etching, the oxide film spacer is formed on the region that becomes the LDD region of the SOI layer on both side wall sides of the gate electrode. Thereafter, by implanting high-concentration impurity ions into the SOI layer using the gate electrode and the oxide film spacer as a mask, the source junction region and the drain junction region are formed in the SOI layer outside the region below the gate electrode and the oxide film spacer. In this stage, the SOI layer below the oxide film spacer has its impurity concentration maintained low to become the LDD region. By forming the oxide film spacer on the flat portion of reduced film thickness of the SOI layer, the LDD region comes to have the same thickness as that of the channel region, while the source junction region and the drain junction region continuously vary in thickness so that the regions in the vicinity of the LDD region have a thickness that becomes gradually thicker from the LDD region side toward the outside. In the semiconductor device fabricated as above, the position of the gate electrode is determined with respect to the positions of the source junction region and the drain junction region outside the LDD region. Therefore, the dispersion in electrical characteristics can be reduced. The source junction region and drain junction region of the SOI layer are made thicker than the channel region. Therefore, the resistances of the source and drain junction regions themselves are reduced. The LDD region of the SOI layer comes to have the same thickness as that of the channel region having a small film thickness, and therefore, the increase of capacity between the gate electrode and the LDD region and that between the gate electrode and the source and drain junction regions are restrained, allowing the operating speed of the transistor to be significantly improved. Furthermore, the side wall shape of the gate electrode is formed roughly perpendicularly to the SOI substrate, and therefore, the gate electrode does not overlap the source and drain junction regions. In the case where the silicide process is applied, the bridge shortcircuit between the gate electrode and the source and drain junction regions can be prevented.

In one embodiment, the channel region of the SOI layer has a thickness of 5 to 100 nm, and the source junction region and the drain junction region of the SOI layer have a thickness of 50 to 500 nm.

According to the semiconductor device of the above embodiment, the channel region of the SOI layer becomes a completely depleted type to have an improved degree of carrier mobility when the thickness is within the range of 5 to 50 nm and becomes a partially depleted type to have practically sufficient carrier mobility when the thickness is within the range of 50 to 100 nm. If the thickness of the channel region is smaller than 5 nm, then the film thickness control is difficult to increase the variation in electrical characteristics to a disadvantage. If the thickness of the channel region exceeds 100 nm, then a reduction in the degree of carrier mobility emerges as a problem. The source junction region and drain junction region of the SOI layer are allowed to have a reduced resistance when the thickness is within the range of 50 to 500 nm. However, if the thickness is smaller than 50 nm, then the resistance becomes high to a disadvantage. If the thickness of each of the source junction region and drain junction region of the SOI layer exceed 500 nm, then much time is required for the formation of the SOI layer, and the reduction in time of the fabricating process cannot easily be achieved.

In one embodiment, the insulating layer of the SOI substrate is either the oxide film or the nitride film.

According to the semiconductor device of the above embodiment, the monocrystal thin film can easily be formed as the SOI layer on the insulating layer that serves as the foundation by using the oxide film or nitride film of the semiconductor material of the SOI layer formed on the insulating layer as the insulating layer of the SOI layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
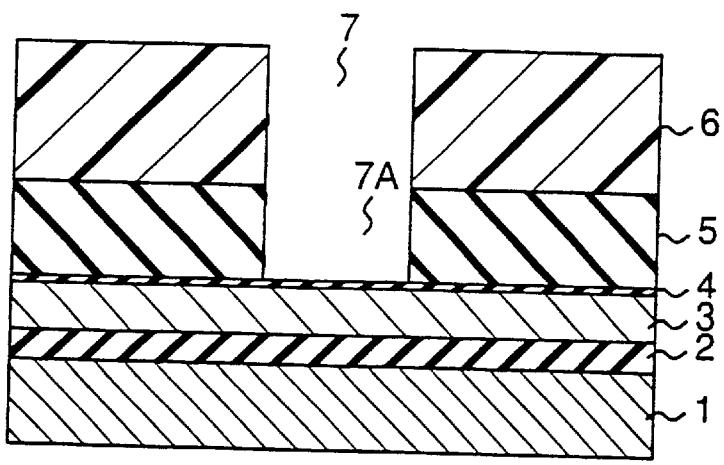
FIGS. 1A through 1D are process charts for explaining a semiconductor device fabricating method according to a first embodiment of the present invention.

The semiconductor device and fabricating method of the present invention will be described in detail below on the basis of the embodiments shown in the drawings.

(First Embodiment)

FIGS. 1A through 1D and FIGS. 2A through 2D are process charts for explaining the semiconductor device fabricating method of the first embodiment of the present invention.

First of all, as shown in FIG. 1A, in a SOI substrate constructed of a silicon substrate 1, an insulating layer 2 and a SOI layer 3, there are successively formed a first oxide film 4 and a nitride film 5 on the SOI layer 3. Then, a resist mask 6 is patterned on the nitride film 5 to form an opening 7, and the nitride film 5 is etched to form an opening 7A in the nitride film 5. It is to be noted that the SOI layer 3 has a film thickness of 150 nm.

Figure 1B:
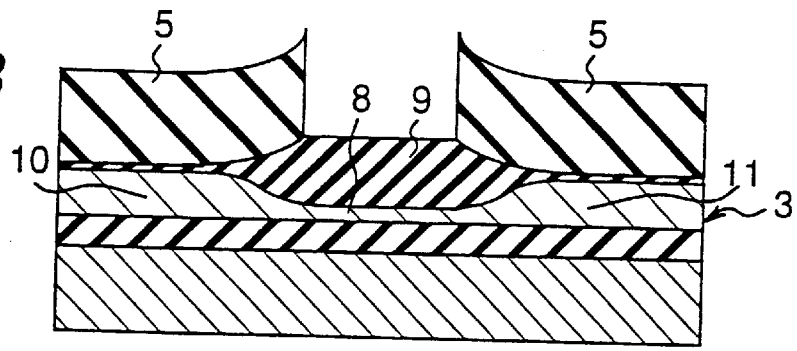

Next, as shown in FIG. 1B, the resist mask 6 (shown in FIG. 1A) is removed, and thereafter, LOCOS (Local Oxidation of Silicon) is executed so that a portion 8 that becomes the channel region of the SOI layer 3 comes to have a specified film thickness (50 nm, for example), forming a selection oxide film 9. In this stage, a portion 10 that becomes the source junction region and a portion 11 that becomes the drain junction region of the SOI layer 3 are covered with the nitride film 5. Therefore, the above portions 10 and 11 are not oxidized, so that the portions 10 and 11 do not change in thickness.

Figure 1C:
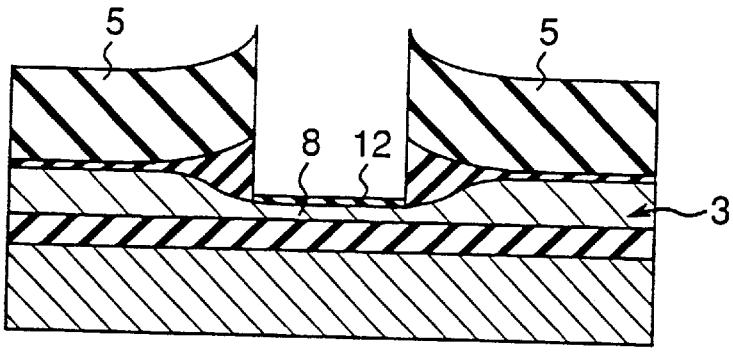

Next, as shown in FIG. 1C, the selection oxide film 9 (shown in FIG. 1B) is etched roughly perpendicularly to the SOI substrate until the portion 8 that becomes the channel region of the SOI layer 3 is exposed using the nitride film 5 as a mask, and thereafter, a gate oxide film 12 is formed on the portion 8 that becomes the channel region of the exposed SOI layer 3. When etching the LOCOS-oxidized selection oxide film 9, the bird's beak portions (of which the cross section is gradually reduced in thickness outward) on both sides of the selection oxide film 9 are not etched, differently from the prior art semiconductor device fabricating method shown in FIG. 14.

As a result, a gate electrode 14 (shown in FIG. 2A) formed in the subsequent process is controlled to be restrained from overlapping the LOCOS ends of the portion 10 that becomes the source junction region and the portion 11 that becomes the drain junction region of the SOI layer 3, reducing a leak current attributed to the crystal defect at the LOCOS ends.

It is also acceptable to form a sacrifice oxide film on the surface of the SOI layer for the removal of a damaged layer on the surface of the SOI layer due to the etching of the selection oxide film 9, remove the sacrifice oxide film through wet processing with HF or the like and thereafter form a gate oxide film on the SOI layer. In this state, the side wall shape of the etched selection oxide film is formed roughly perpendicularly.

Figure 1D:
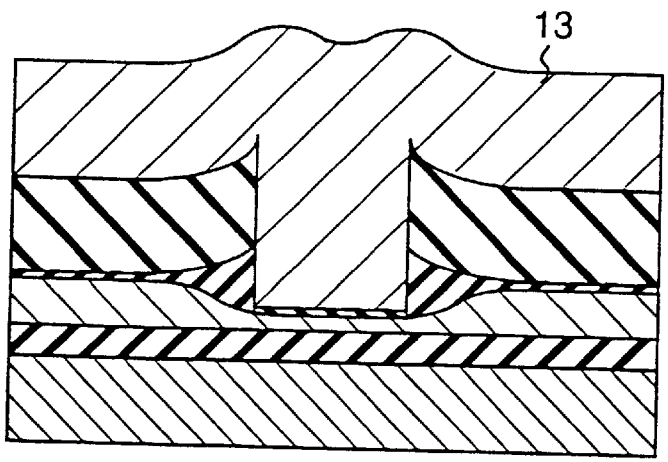

Next, as shown in FIG. 1D, a polysilicon layer 13 is formed on the entire SOI substrate.

Figure 2A:
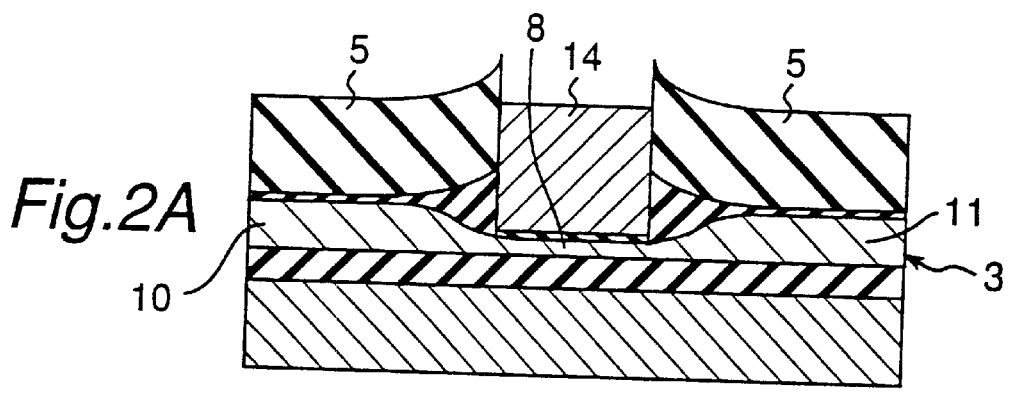
FIGS. 2A through 2D are process charts for explaining the above semiconductor device fabricating method continued from FIG. 1D.

Subsequently, as shown in FIG. 2A, the polysilicon layer 13 (shown in FIG. 1D) is etched back until the polysilicon layer 13 is removed from the surface of the nitride film 5, and a gate electrode 14 made of polysilicon is formed by leaving the polysilicon layer only above the portion 8 that becomes the channel region of the SOI layer 3. Therefore, the alignment process is eliminated from the formation of the gate electrode 14 and this gate electrode 14 is transferred onto the channel region, as a consequence of which the side wall shape of the gate electrode 14 becomes roughly perpendicular to the SOI substrate.

Figure 2B:
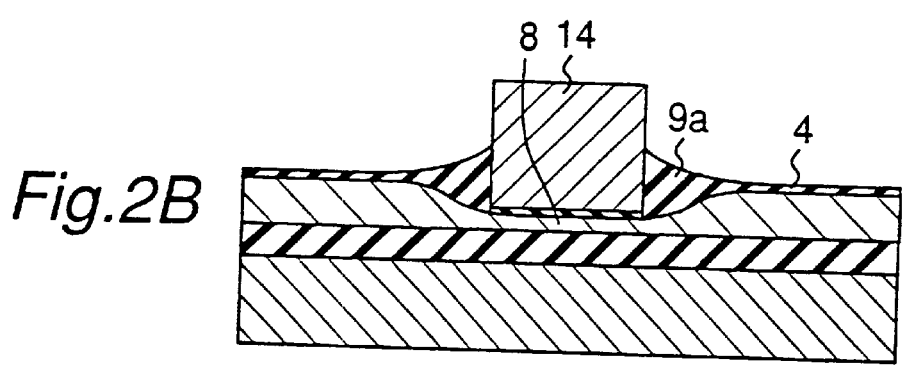

Subsequently, as shown in FIG. 2B, the nitride film 5 (shown in FIG. 2A) is removed, and subsequently a selection oxide film 9a having a bird's beak shape on both sides of the gate electrode 14 and the first oxide film 4 are removed. It is to be noted that this first oxide film 4 must be removed since the film 4 is damaged in the LOCOS oxidation stage.

Figure 2C:
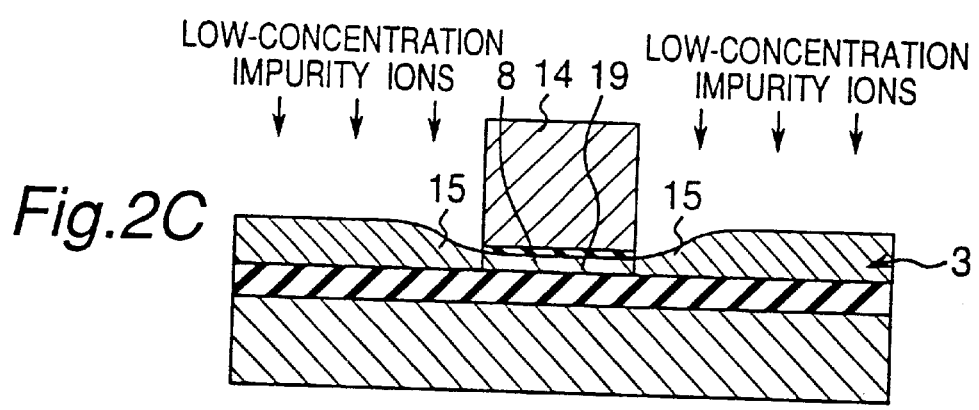

Next, as shown in FIG. 2C, low-concentration impurity ions are implanted into the SOI layer 3 using the gate electrode 14 as a mask, forming portions 15 and 15 that become the LDD regions outside the portion 8 that becomes the channel region of the SOI layer 3. Then, the region of the SOI layer 3 below the gate electrode 14 becomes the channel region 19.

Figure 2D:
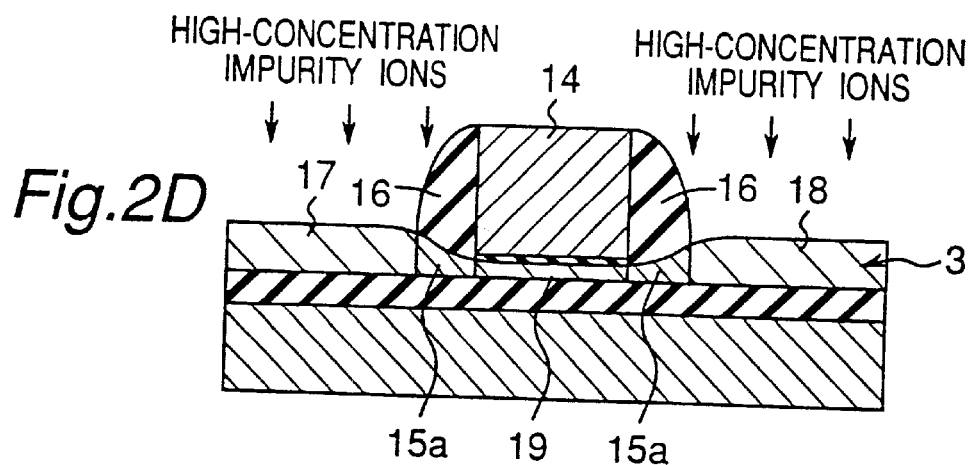

Next, as shown in FIG. 2D, oxide film spacers 16 and 16 are formed on both side wall sides of the gate electrode 14 by forming a second oxide film on the entire SOI substrate and subjecting the second oxide film to anisotropic etching, and finally high-concentration impurity ions are implanted into the SOI layer 3 using the gate electrode 14 and the oxide film spacers 16 and 16 as a mask, forming LDD regions 15a and 15a on both sides of the channel region 19 (the portion 8 that becomes the channel region shown in FIG. 2C) of the SOI layer 3. Then a source junction region 17 and a drain junction region 18 are formed outside the LDD regions 15a and 15a.

In the transistor formed on the SOI layer 3 by the above semiconductor device fabricating method, the position of the gate electrode 14 is automatically determined with respect to the positions of the source junction region 17 and the drain junction region 18. Therefore, the desired transistor structure can easily be formed independently of the accuracy of the exposure apparatus, and the dispersion in electrical characteristics can be reduced.

According to the above transistor, the source junction region 17 and the drain junction region 18 are formed thicker than the channel region 19, and therefore, the resistances of the junction regions 17 and 18 themselves are reduced. The LDD regions 15a and 15a continuously vary in thickness so that the LDD regions 15a and 15a become gradually thicker from the channel region 19 side toward the source junction region 17 side and the drain junction region 18 side, and the gate electrode 14 and the LDD regions 15a and 15a are separated apart from each other. Therefore, a capacitance between the gate electrode 14 and the LDD regions 15a and 15a does not increase, scarcely varying the capacitance of the gate electrode 14. Therefore, the possible reduction in operating speed of the transistor can be restrained.

The side wall of the gate electrode 14 is formed roughly perpendicularly to the SOI substrate and the oxide film spacers 16 and 16 are formed as side walls on both side wall sides of the gate electrode 14. Therefore, the controllability of high-concentration impurity ion implantation into the SOI layer portion where the source and drain regions 17 and 18 are formed is improved and the bridge shortcircuit between the gate electrode 14 and the source and drain regions 17 and 18 in the silicide process can also be prevented.

(Second Embodiment)

FIGS. 3A through 3D, FIGS. 4A through 4D and FIGS. 5A and 5B are process charts for explaining the semiconductor device fabricating method of the second embodiment of the present invention. It is to be noted that the same components as those of the first embodiment are denoted by the same reference numerals.

Figure 3A:
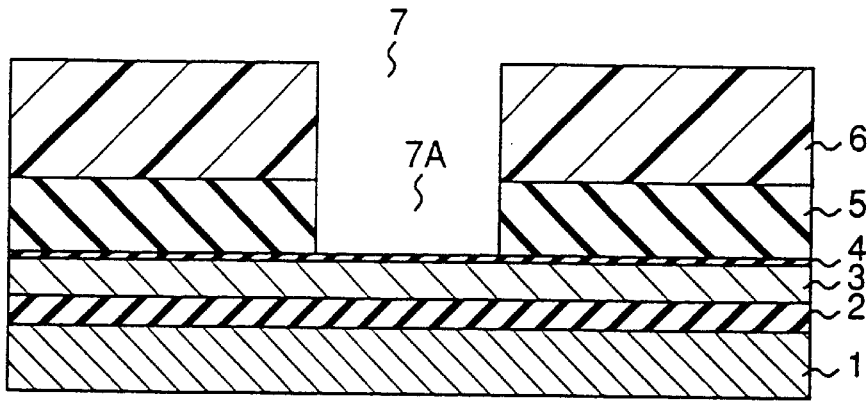
FIGS. 3A through 3D are process charts for explaining a semiconductor device fabricating method according to a second embodiment of the present invention.

First of all, as shown in FIG. 3A, in a SOI substrate constructed of a silicon substrate 1, an insulating layer 2 and a SOI layer 3, there are successively formed a first oxide film 4 and a first nitride film 5 on the SOI layer 3. Then, a resist mask 6 is patterned on the first nitride film 5 to form an opening 7, and the first nitride film 5 is etched to form an opening 7A in the first nitride film 5. It is to be noted that the SOI layer 3 has a film thickness of 150 nm.

Figure 3B:
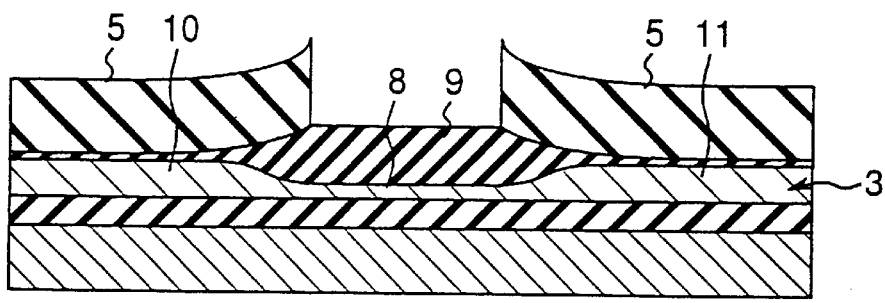

Next, as shown in FIG. 3B, the resist mask 6 (shown in FIG. 3A) is removed, and thereafter, LOCOS process is executed so that a portion 8 that becomes the channel region and LDD regions of the SOI layer 3 comes to have a specified film thickness (50 nm, for example), forming a selection oxide film 9. In this stage, a portion 10 that becomes the source junction region and a portion 11 that becomes the drain junction region of the SOI layer 3 are covered with the first nitride film 5. Therefore, the above portions 10 and 11 are not oxidized, so that the portions 10 and 11 do not change in thickness. The above processes are the same as those of the first embodiment.

Figure 3C:
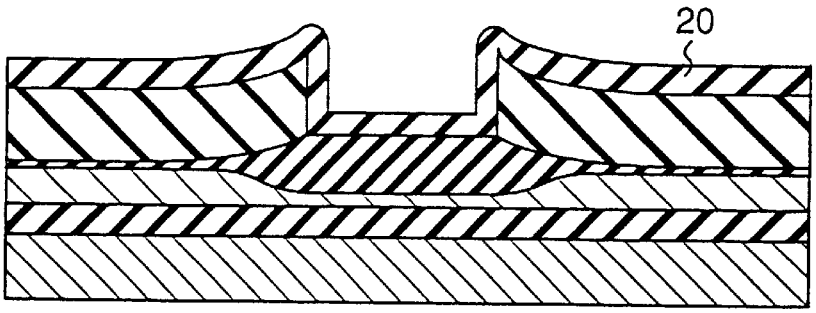

Subsequently, as shown in FIG. 3C, a second nitride film 20 is formed on the entire SOI substrate.

Figure 3D:
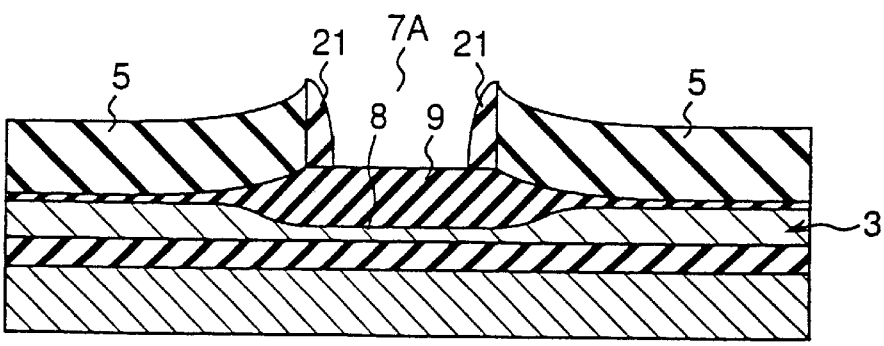

Next, as shown in FIG. 3D, the second nitride film 20 is etched back by anisotropic etching until the selection oxide film 9 above the portion 8 that becomes the channel region and LDD region of the SOI layer 3 is exposed. Through this process, nitride film spacers 21 and 21 are formed on the inner wall side of the opening 7A of the previously formed first nitride film 5.

Figure 4A:
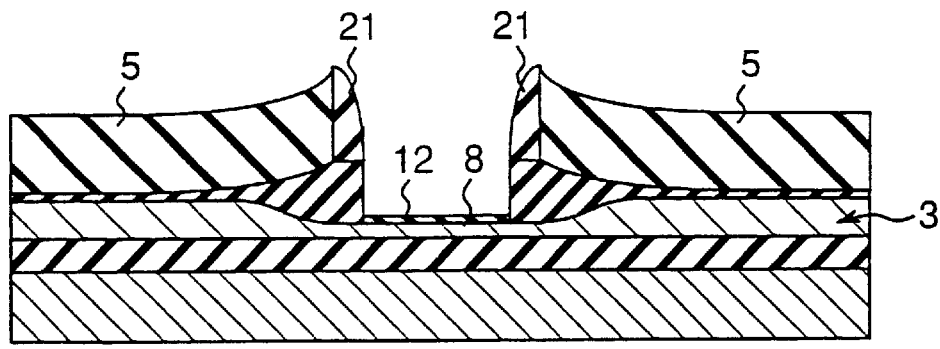
FIGS. 4A through 4D are process charts for explaining the above semiconductor device fabricating method continued from FIG. 3D.

Subsequently, as shown in FIG. 4A, the selection oxide film 9 is etched roughly perpendicularly to the SOI substrate to the depth of the portion 8 that becomes the channel region of the SOI layer 3 using the first nitride film 5 and the nitride film spacers 21 and 21 as a mask, and thereafter, a gate oxide film 12 is formed.

During the etching of this selection oxide film 9, a further margin to the LOCOS ends is provided by the nitride film spacer 21 in contrast to the first embodiment, and this allows a gate electrode 24 (shown in FIG. 4C) that will be formed in the subsequent process to be restrained from overlapping the LOCOS ends of the SOI layer 3, further reducing the leak current attributed to the crystal defect at the LOCOS ends.

Figure 4B:
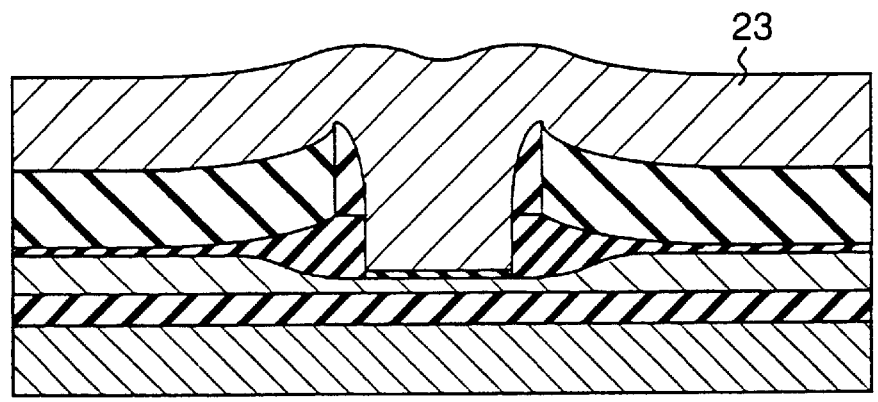

Next, as shown in FIG. 4B, a polysilicon layer 23 is formed on the entire SOI substrate.

Figure 4C:
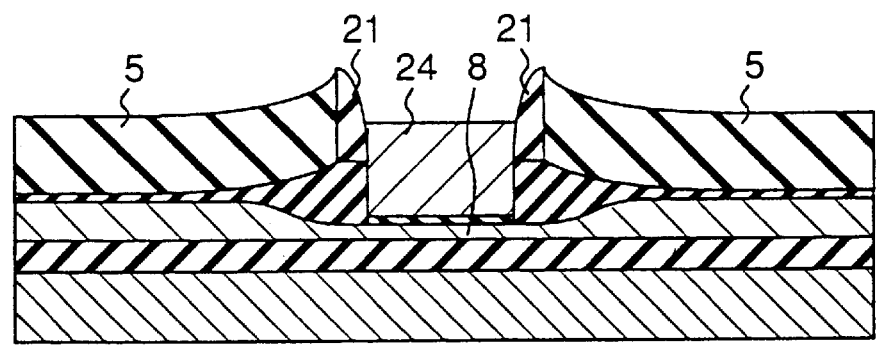

Subsequently, as shown in FIG. 4C, the polysilicon layer 23 is etched back until the polysilicon layer 23 is removed from the surface of the first nitride film 5, and a gate electrode 24 made of polysilicon is formed by leaving the polysilicon layer only above the portion 8 that becomes the channel region and LDD region of the SOI layer 3.

Figure 4D:
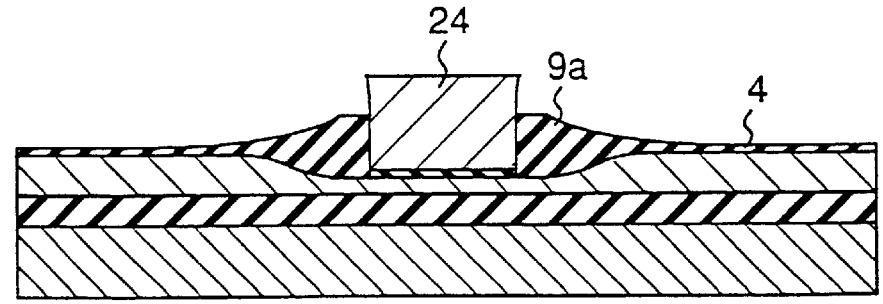

Next, as shown in FIG. 4D, the first nitride film 5 (shown in FIG. 4C) and the nitride film spacers 21 and 21 (shown in FIG. 4C) on both sides of the gate electrode 24 are removed.

Figure 5A:
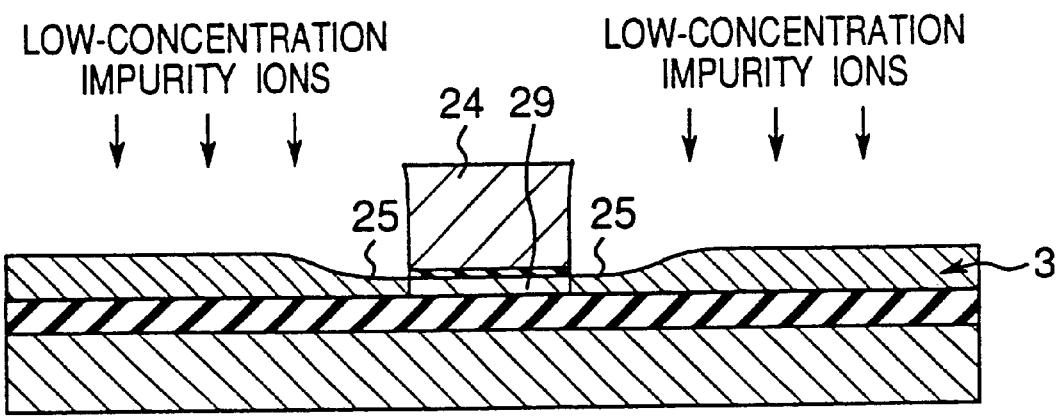
FIGS. 5A and 5B are process charts for explaining the above semiconductor device fabricating method continued from FIG. 4D.

Subsequently, as shown in FIG. 5A, a selection oxide film 9a having a bird's beak shape and the first oxide film 4 (shown in FIG. 4D) are removed. Next, low-concentration impurity ions are implanted into the SOI layer 3 using the gate electrode 24 as a mask, forming portions 25 and 25 that become the LDD region in the SOI layer 3 outside the region below the gate electrode 24. Then, the region of the SOI layer 3 below the gate electrode 24 becomes the channel region 29.

Figure 5B:
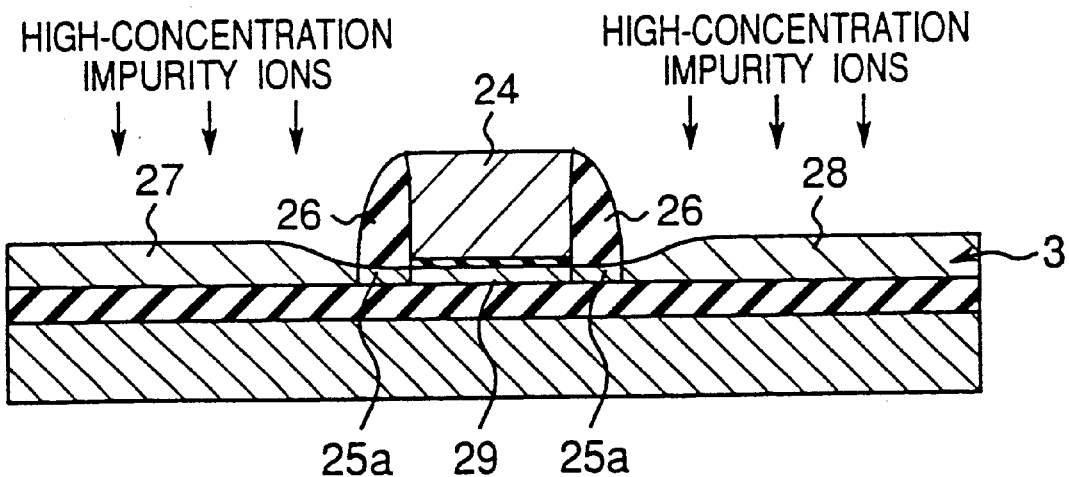

Next, as shown in FIG. 5B, oxide film spacers 26 and 26 are formed on both side wall sides of the gate electrode 24 by forming a second oxide film on the entire SOI substrate and subjecting the second oxide film to anisotropic etching, and finally high-concentration impurity ions are implanted into the SOI layer 3 using the gate electrode 24 and the oxide film spacers 26 and 26 as a mask, forming LDD regions 25a and 25a on both sides of the channel region 29 of the SOI layer 3, and forming a source junction region 27 and a drain junction region 28 outside the LDD regions 25a and 25a.

In the transistor formed on the SOI layer by the above semiconductor device fabricating method, the position of the gate electrode 24 is automatically determined with respect to the positions of the source junction region 27 and the drain junction region 28. Therefore, the desired transistor structure can easily be formed independently of the accuracy of the exposure apparatus. The LDD regions 25a and 25a can be formed with the same thickness as that of the channel region 29 by forming the above nitride film spacers 21 and 21, and therefore, the dispersion in electrical characteristics can be further reduced.

Furthermore, in the above transistor, the source junction region 27 and the drain junction region 28 are formed thicker than the channel region 29 and the LDD regions 25a and 25a, and therefore, the resistances of the junction regions themselves are reduced. The source junction region 27 and the drain junction region 28 in the vicinity of the LDD regions 25a and 25a continuously vary in thickness so that the regions become gradually thicker from the LDD regions 25a and 25a side toward the outside, and the gate electrode 24 is separated apart from the source and drain junction regions 27 and 28. Therefore, a capacitance between the gate electrode 24 and the source and drain junction regions 27 and 28 does not increase, scarcely varying the capacitance of the gate electrode 24. Therefore, the reduction in operating speed of the transistor can be restrained.

The side wall of the gate electrode 24 is formed roughly perpendicularly to the SOI substrate and the oxide film spacers 26 and 26 are formed as side walls on both side wall sides of the gate electrode 24. Therefore, the controllability of high-concentration impurity ion implantation into the SOI layer portion where the source and drain regions 27 and 28 are formed is improved and the bridge shortcircuit between the gate electrode 24 and the source and drain regions 27 and 28 in the silicide process can also be prevented.

(Third Embodiment)

FIGS. 6A through 6D and FIGS. 7A through 7E are process charts for explaining the semiconductor device fabricating method of the third embodiment of the present invention. It is to be noted that the same components as those of the first embodiment are denoted by the same reference numerals.

Figure 6A:
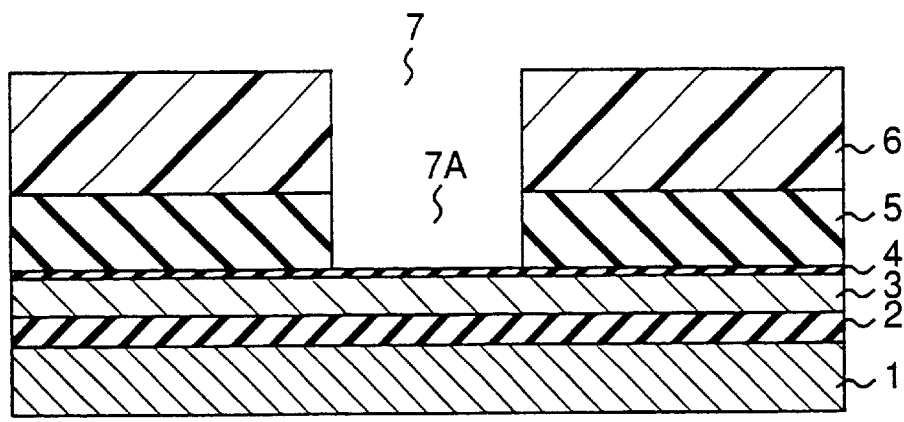
FIGS. 6A through 6D are process charts for explaining a semiconductor device fabricating method according to a third embodiment of the present invention.

First of all, as shown in FIG. 6A, in a SOI substrate constructed of a silicon substrate 1, an insulating layer 2 and a SOI layer 3, there are successively formed a first oxide film 4 and a first nitride film 5 on the SOI layer 3. Then, a resist mask 6 is patterned on the first nitride film 5 to form an opening 7, and the first nitride film 5 is etched to form an opening 7A in the first nitride film 5. It is to be noted that the SOI layer 3 has a film thickness of 150 nm.

Figure 6B:
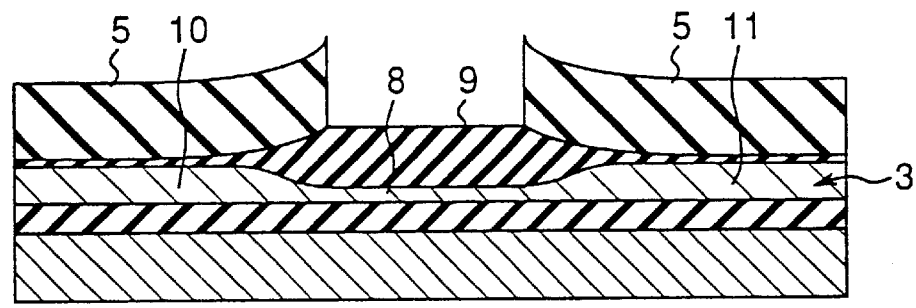

Next, as shown in FIG. 6B, a resist mask 6 (shown in FIG. 6A) is removed, and thereafter, LOCOS process is executed so that a portion 8 that becomes the channel region and LDD region of the SOI layer 3 comes to have a specified film thickness (50 nm, for example), forming a selection oxide film 9. In this stage, a portion 10 that becomes the source junction region and a portion 11 that becomes the drain junction region of the SOI layer 3 are covered with the first nitride film 5. Therefore, the above portions are not oxidized, so that the portions do not change in thickness. The above processes shown in FIGS. 6A and 6B are the same as those of the first embodiment.

Figure 6C:
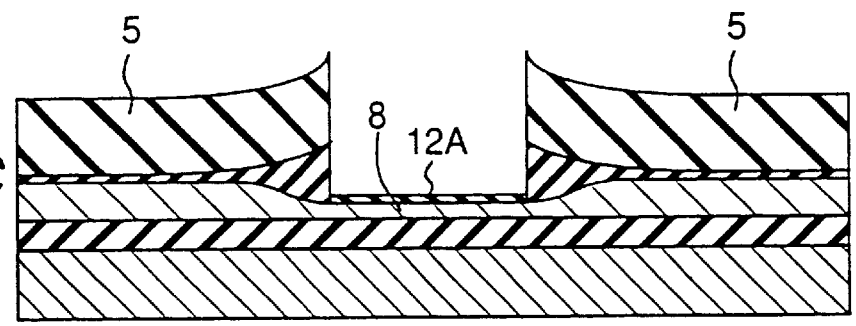

Subsequently, as shown in FIG. 6C, the selection oxide film 9 (shown in FIG. 6B) is etched roughly perpendicularly to the SOI substrate using the first nitride film 5 as a mask until the portion 8 that becomes the channel region and LDD region of the SOI layer 3 is exposed. Thereafter, a second oxide film 12A is formed on the exposed SOI layer 3.

Figure 6D:
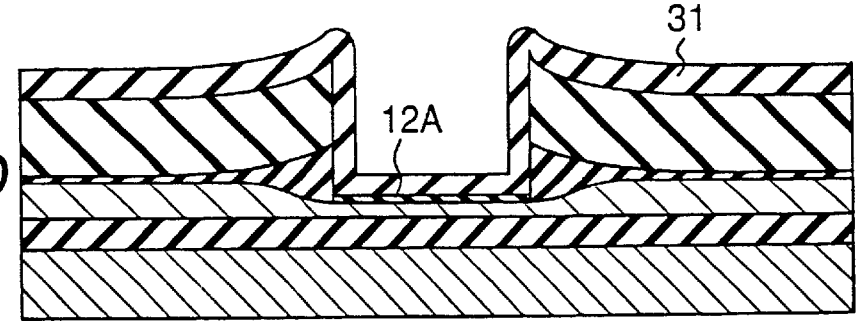

Subsequently, as shown in FIG. 6D, a second nitride film 31 is formed on the entire SOI substrate.

Figure 7A:
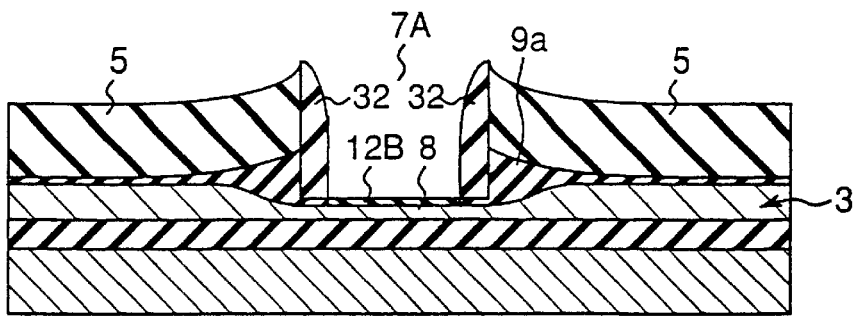
FIGS. 7A through 7E are process charts for explaining the above semiconductor device fabricating method continued from FIG. 6D.

Next, as shown in FIG. 7A, the second nitride film 31 (shown in FIG. 6D) is etched back by anisotropic etching until the second oxide film 12A (shown in FIG. 6D) above the portion 8 that becomes the channel region and LDD region of the SOI layer 3 is exposed. In this stage, nitride film spacers 32 and 32 are formed on the inner wall side of the opening 7A of the previously formed first nitride film 5 and the opening of the selection oxide film 9 continued from the first nitride film 5. Subsequently, the second oxide film 12A is removed by wet processing with HF or the like. Thereafter, a gate second oxide film 12B is formed above the portion 8 that becomes the channel region of the SOI layer 3.

In this process of removing the second oxide film 12A, the side etching in the horizontal direction is restrained by virtue of the existence of the nitride film spacers 32, producing the effect that the controllability of gate length can be improved.

A further margin to the LOCOS ends is provided by the nitride film spacer 32 in contrast to the first embodiment, and this allows a gate electrode 34 to be restrained from overlapping the LOCOS ends of the SOI layer 3, further reducing the leak current attributed to the crystal defect at the LOCOS ends.

Figure 7B:
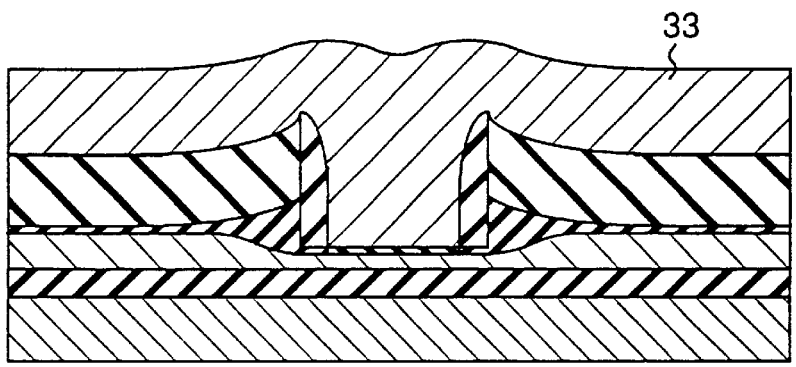

Next, as shown in FIG. 7B, a polysilicon layer 33 is formed on the entire SOI substrate.

Figure 7C:
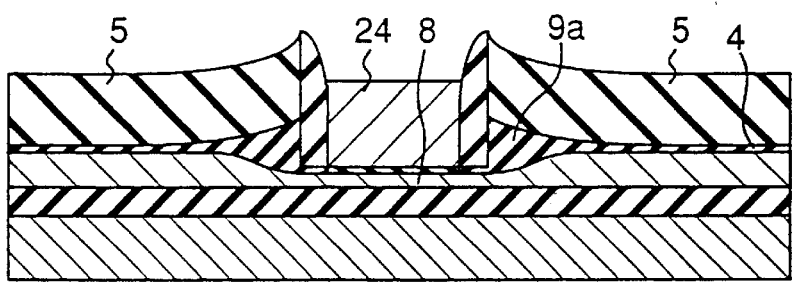

Subsequently, as shown in FIG. 7C, the polysilicon layer 33 is etched back until the polysilicon layer 33 is removed from the surface of the first nitride film 5, and a gate electrode 34 made of polysilicon is formed by leaving the polysilicon layer only above the portion 8 that becomes the channel region and LDD region of the SOI layer 3.

Figure 7D:
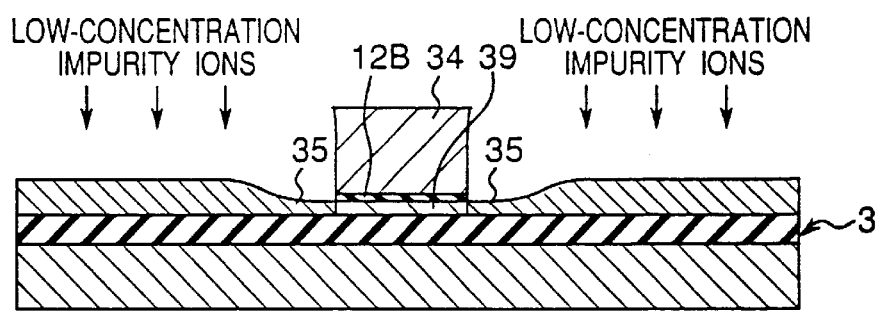

Next, as shown in FIG. 7D, the first nitride film 5 (shown in FIG. 7C) is removed, and thereafter, the selection oxide film 9a having a bird's beak shape and the first oxide film 4 (shown in FIG. 7C) are removed. Subsequently, low-concentration impurity ions are implanted into the SOI layer 3 using the gate electrode 34 as a mask, forming portions 35 and 35 that become the LDD region in the SOI layer 3 outside the region below the gate electrode 34. Then, the region of the SOI layer 3 below the gate electrode 34 becomes the channel region 39.

Figure 7E:
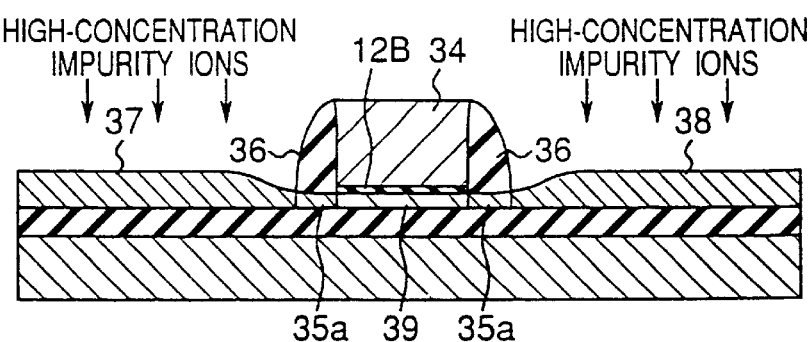

Next, as shown in FIG. 7E, oxide film spacers 36 and 36 are formed on both side wall sides of the gate electrode 34 by forming a second oxide film on the entire SOI substrate and subjecting the second oxide film to anisotropic etching, and finally high-concentration impurity ions are implanted into the SOI layer 3 using the gate electrode 34 and the oxide film spacers 36 and 36 as a mask, forming LDD regions 35a and 35a on both sides of the channel region 39 of the SOI layer 3, and forming a source junction region 37 and a drain junction region 38 outside the LDD regions 35a and 35a.

In the transistor formed on the SOI layer by the above semiconductor device fabricating method, the position of the gate electrode 34 is automatically determined with respect to the positions of the source junction region 37 and the drain junction region 38. Therefore, the desired transistor structure can easily be formed independently of the accuracy of the exposure apparatus. The LDD regions 35a and 35a can be formed with the same thickness as that of the channel region 39 by forming the above oxide film spacers 36 and 36 similarly to the second embodiment, and therefore, the dispersion in electrical characteristics can be reduced.

Furthermore, in the above transistor, the source junction region 37 and the drain junction region 38 are formed thicker than the channel region 39 and the LDD regions 35a and 35a, and therefore, the resistances of the junction regions themselves are reduced. The source junction region 37 and the drain junction region 38 in the vicinity of the LDD regions 35a and 35a continuously vary in thickness so that the regions become gradually thicker from the LDD regions 35a and 35a side toward the outside, and the gate electrode 34 is separated apart from the source and drain junction regions 37 and 38. Therefore, a capacitance between the gate electrode 34 and the source and drain junction regions 37 and 38 does not increase, scarcely varying the capacitance of the gate electrode 34. Therefore, the reduction in operating speed of the transistor can be restrained.

The side wall of the gate electrode 34 is formed roughly perpendicularly to the SOI substrate and the oxide film spacers 36 and 36 are formed as side walls on both side wall sides of the gate electrode 34. Therefore, the controllability of high-concentration impurity ion implantation into the SOI layer portion where the source and drain regions 37 and 38 are formed is improved and the bridge shortcircuit between the gate electrode 34 and the source and drain regions 37 and 38 in the silicide process can also be prevented.

Fourth Embodiment

FIGS. 8A through 8D, FIGS. 9A through 9D and FIGS. 10A and 10B are process charts for explaining the semiconductor device fabricating method of the fourth embodiment of the present invention. It is to be noted that the same components as those of the first embodiment are denoted by the same reference numerals.

Figure 8A:
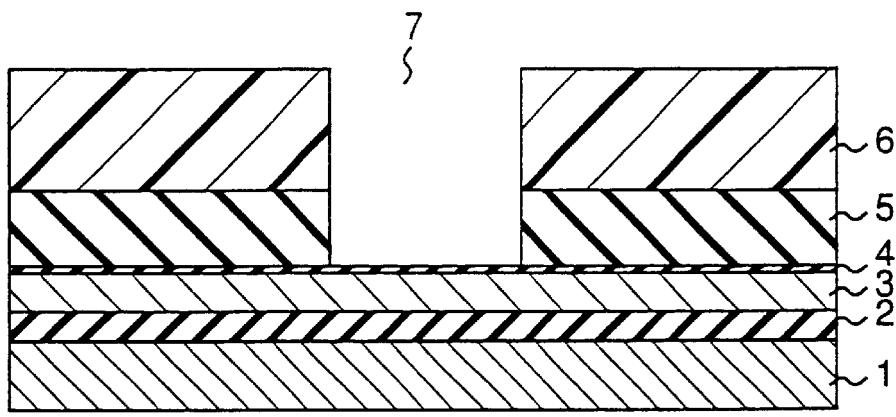
FIGS. 8A through 8D are process charts for explaining a semiconductor device fabricating method according to a fourth embodiment of the present invention.

First of all, as shown in FIG. 8A, in a SOI substrate constructed of a silicon substrate 1, an insulating layer 2 and a SOI layer 3, there are successively formed a first oxide film 4 and a first nitride film 5 on the SOI layer 3. Then, a resist mask 6 is patterned on the first nitride film 5 to form an opening 7, and the first nitride film 5 is etched to form an opening 7A in the first nitride film 5. It is to be noted that the SOI layer 3 has a film thickness of 150 nm.

Figure 8B:
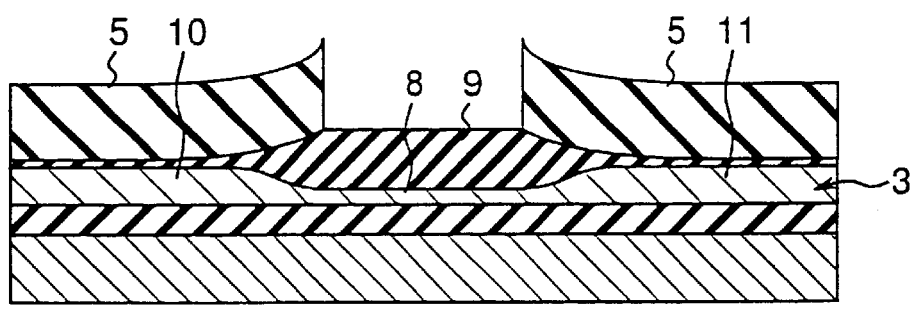

Next, as shown in FIG. 8B, the resist mask 6 (shown in FIG. 8A) is removed, and thereafter, LOCOS process is executed so that a portion 8 that becomes the channel region and LDD region of the SOI layer 3 comes to have a specified film thickness (50 nm, for example), forming a selection oxide film 9. In this stage, a portion 10 that becomes the source junction region and a portion 11 that becomes the drain junction region of the SOI layer 3 are covered with the first nitride film 5. Therefore, the above portions are not oxidized, so that the portions do not change in thickness.

Figure 8C:
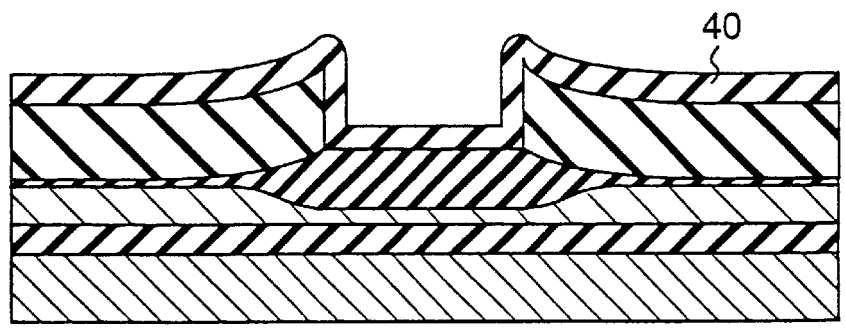

Subsequently, as shown in FIG. 8C, a second nitride film 40 is formed on the entire SOI substrate.

Figure 8D:
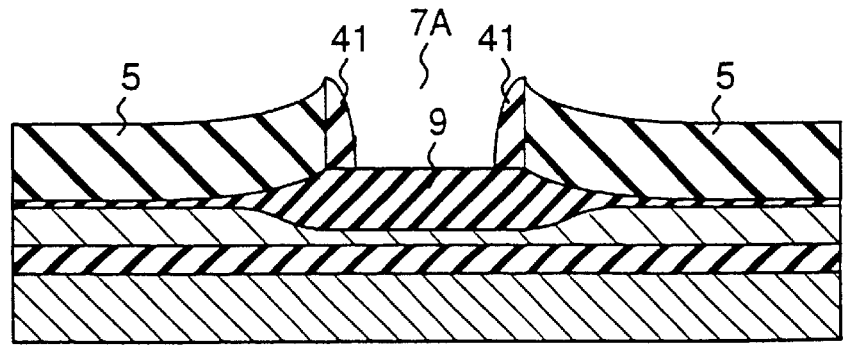

Next, as shown in FIG. 8D, the second nitride film 40 is etched back by anisotropic etching until the selection oxide film 9 is exposed. Through this process, first nitride film spacers 41 and 41 are formed on the inner wall side of the opening 7A of the previously formed first nitride film 5.

Figure 9A:
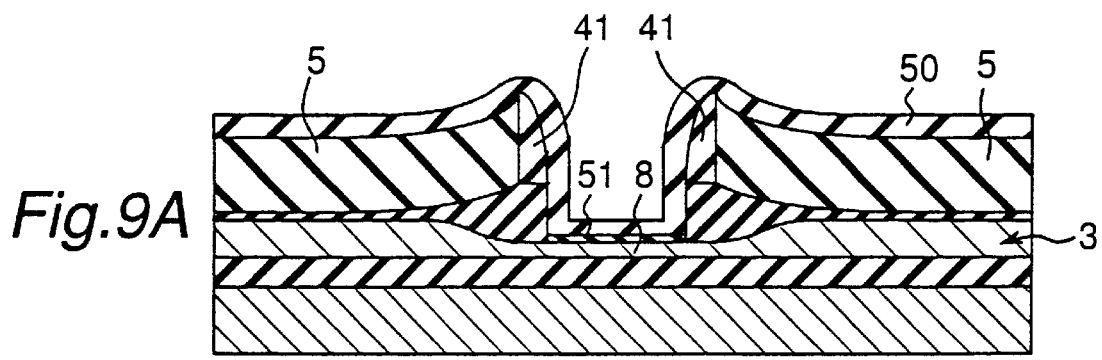
FIGS. 9A through 9D are process charts for explaining the above semiconductor device fabricating method continued from FIG. 8D.

Subsequently, as shown in FIG. 9A, the selection oxide film 9 (shown in FIG. 8D) is etched roughly perpendicularly to the SOI substrate using the first nitride film 5 and the first nitride film spacers 41 and 41 as a mask until the portion 8 that becomes the channel region and LDD region of the SOI layer 3 is exposed. The above processes are the same as those of the second embodiment. Subsequently, an oxide film 51 is formed on the channel region of the portion 8 that becomes the channel region of the SOI layer 3, and thereafter, a third nitride film 50 is formed on the entire SOI substrate.

Figure 9B:
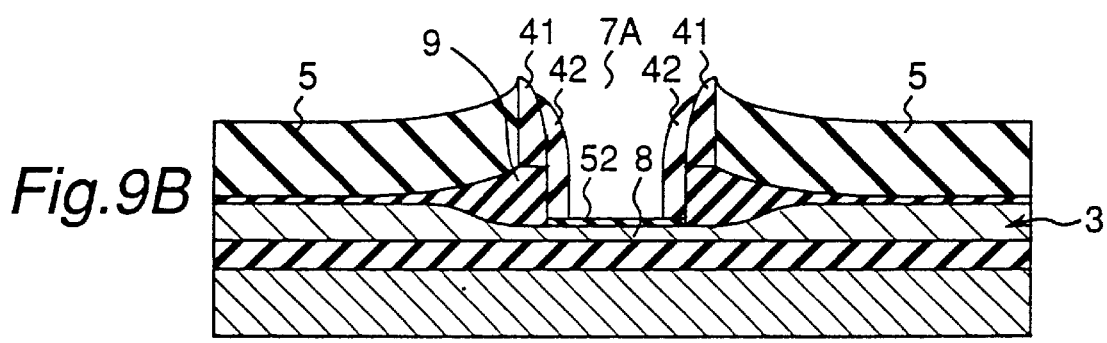

Next, as shown in FIG. 9B, the third nitride film 50 (shown in FIG. 9A) is etched back by anisotropic etching until the channel region of the portion 8 that becomes the channel region and LDD region of the SOI layer 3 is exposed. In this stage, second nitride film spacers 42 and 42 are formed on the inner wall side of the opening of the previously formed first nitride film spacers 41 and 41 and the selection oxide film 9 continued from the spacers. Thereafter, the oxide film 51 (shown in FIG. 9A) is removed by wet processing with HF or the like. Thereafter, a gate oxide film 52 is formed above the portion 8 that becomes the channel region and LDD region of the SOI layer 3.

In this stage, the side etching in the horizontal direction is restrained by virtue of the existence of the second nitride film spacers 42 and 42, similarly to the third embodiment, improving the controllability of gate length.

A further margin to the LOCOS ends is provided by the second nitride film spacers 42 and 42 in contrast to the second embodiment and the third embodiment, and this allows the gate electrode 44 to be restrained from overlapping the LOCOS ends of the SOI layer 3, further reducing the leak current attributed to the crystal defect at the LOCOS ends.

Figure 9C:
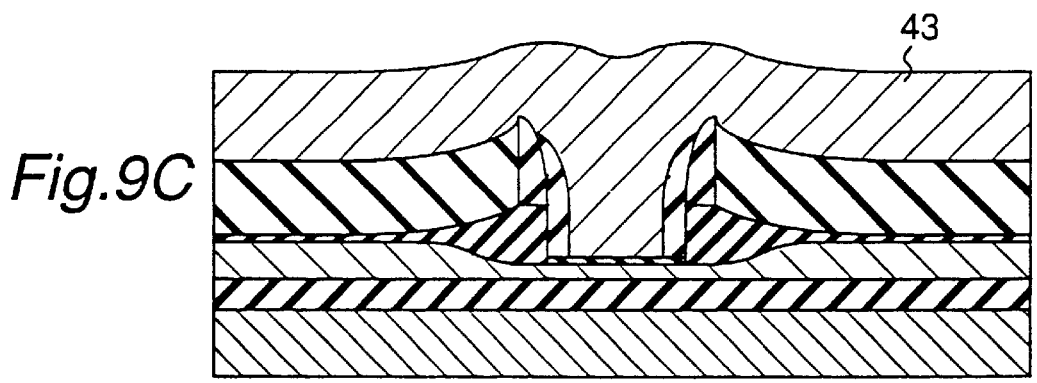

Next, as shown in FIG. 9C, a polysilicon layer 43 is formed on the entire SOI substrate.

Figure 9D:
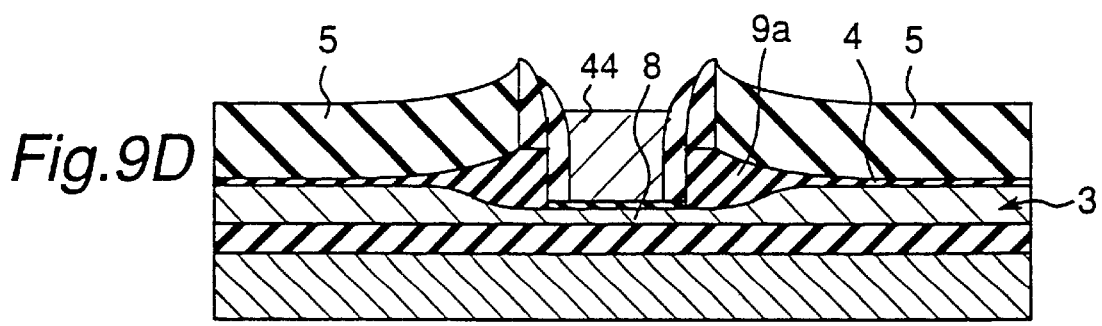

Subsequently, as shown in FIG. 9D, the polysilicon layer 43 (shown in FIG. 9C) is etched back until the polysilicon layer 43 is removed from the surface of the first nitride film 5, and a gate electrode 44 made of polysilicon is formed by leaving the polysilicon layer only above the channel region of the portion 8 that becomes the channel region and LDD region of the SOI layer 3.

Figure 10A:
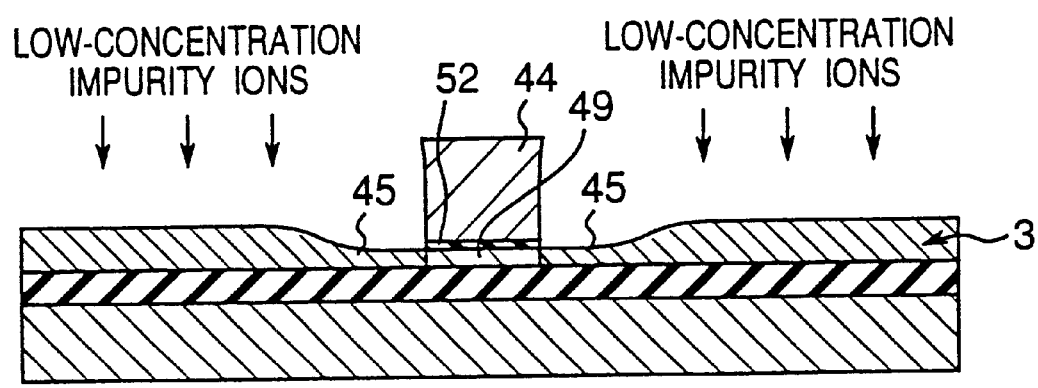
FIGS. 10A and 10B are process charts for explaining the above semiconductor device fabricating method continued from FIG. 9D.

Next, as shown in FIG. 10A, the first nitride film 5 (shown in FIG. 9D) is removed, and thereafter, the selection oxide film 9a having a bird's beak shape and the first oxide film 4 (shown in FIG. 9D) are removed. Subsequently, low-concentration impurity ions are implanted into the SOI layer 3 using the gate electrode 44 as a mask, forming portions 45 and 45 that become the LDD region in the SOI layer 3 outside the region below the gate electrode 44. Then, the region of the SOI layer 3 under the gate electrode 44 and the gate oxide film 52 becomes the channel region 49.

Figure 10B:
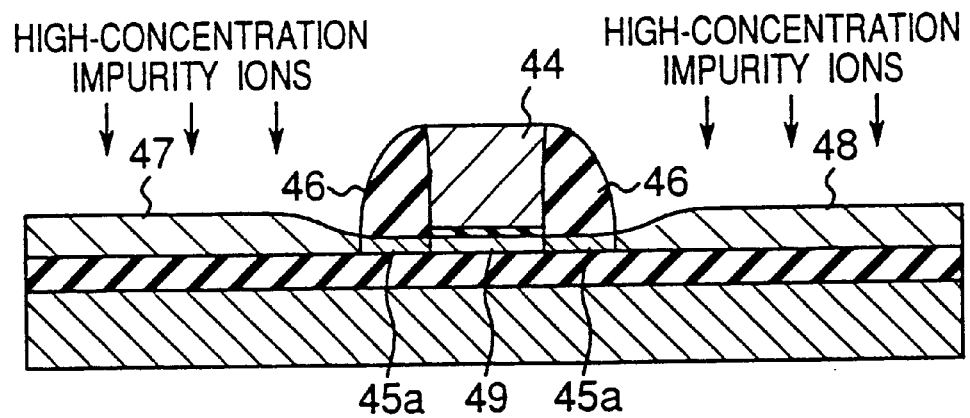
Figure 11:
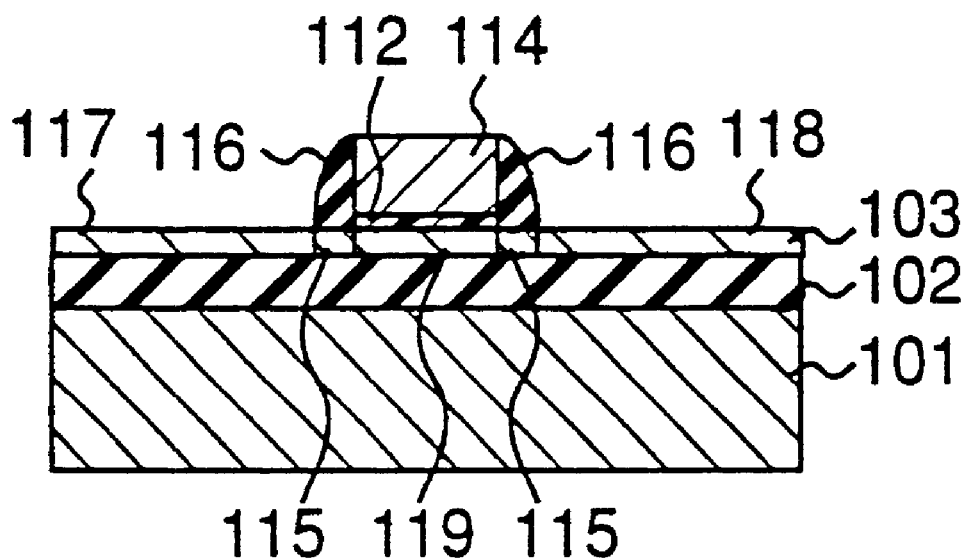
FIG. 11 is a sectional view for explaining a method for fabricating a semiconductor device on a generic SOI substrate.
Figure 12A:
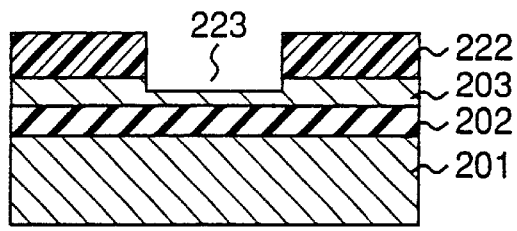
FIGS. 12A through 12E are process charts for explaining a prior art semiconductor device fabricating method.
Figure 12B:
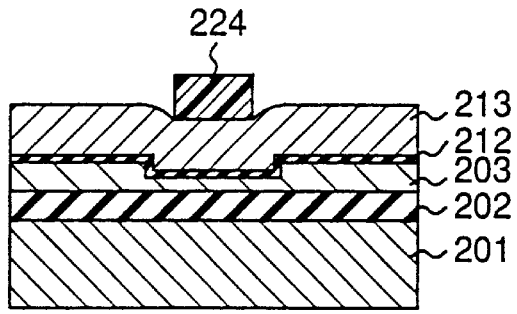
Figure 12C:
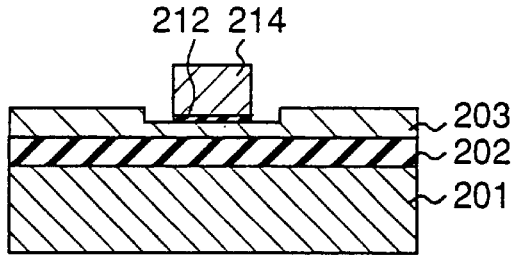
Figure 12D:
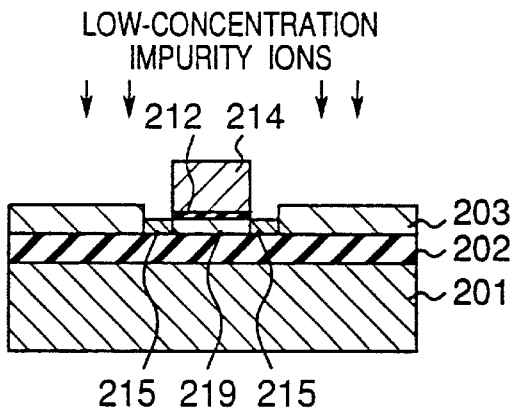
Figure 12E:
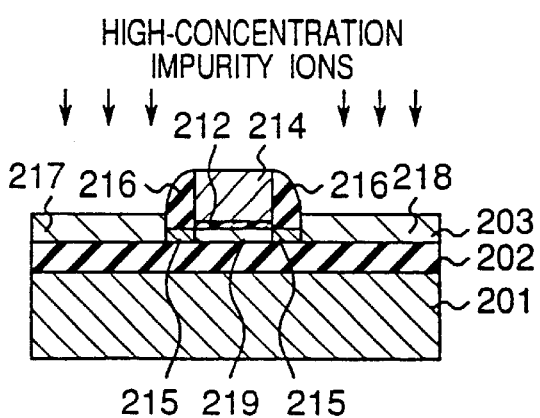
Figure 13A:
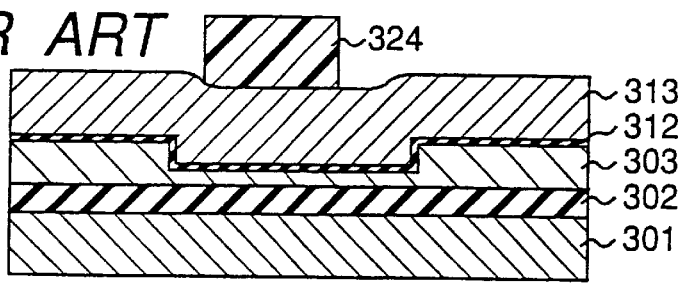
FIGS. 13A through 13E are process charts for explaining a prior art semiconductor device fabricating method.
Figure 13B:
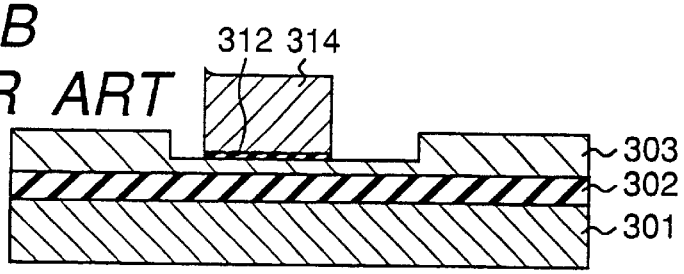
Figure 13C:
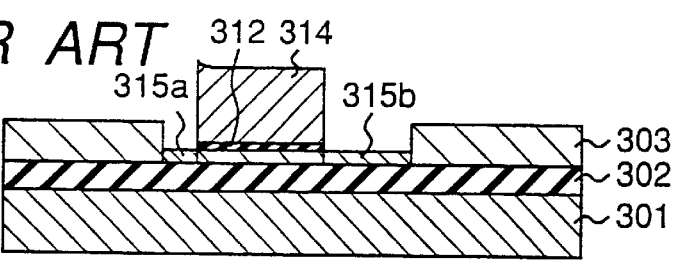
Figure 13D:
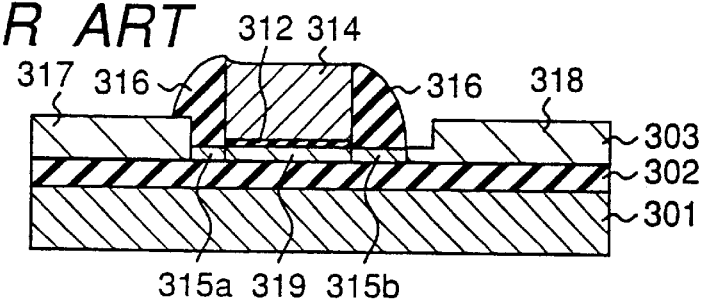
Figure 13E:
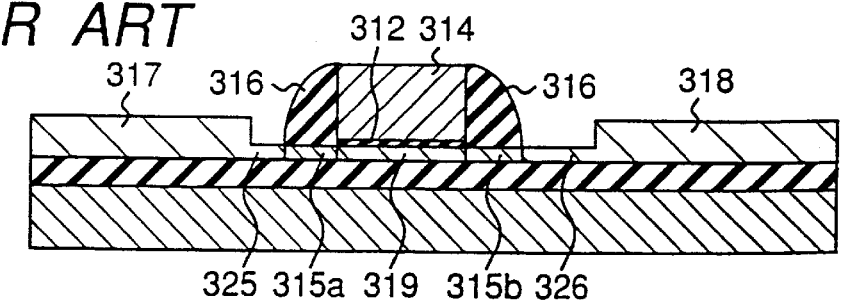
Figure 14A:
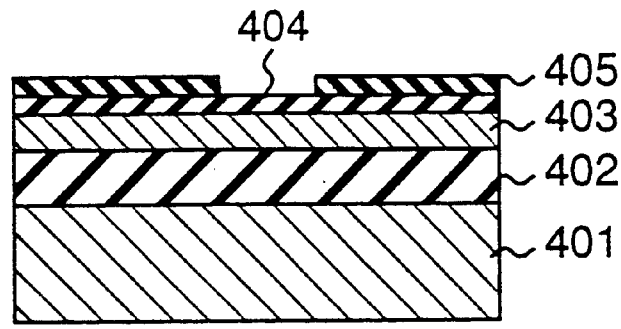
FIGS. 14A through 14D are process charts for explaining another prior art semiconductor device fabricating method.
Figure 14B:
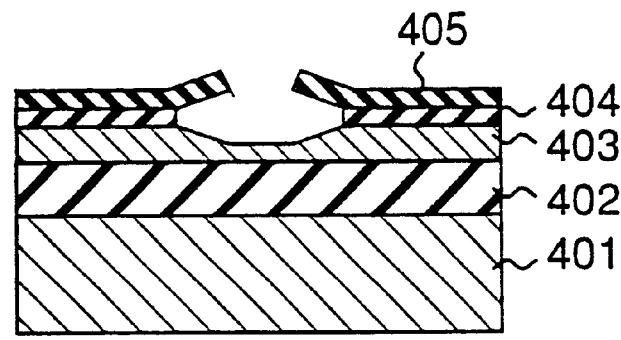
Figure 14C:
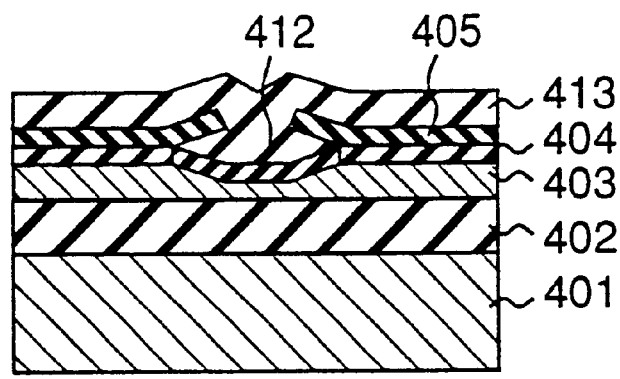
Figure 14D:
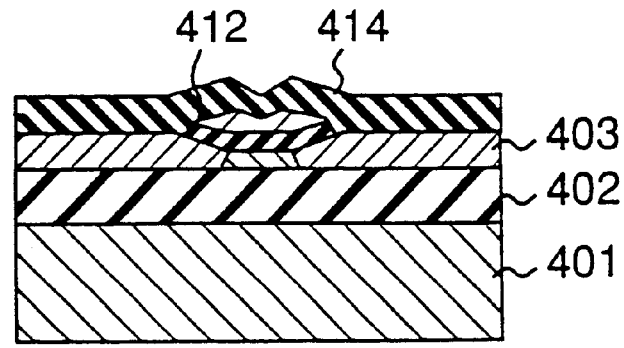

Next, as shown in FIG. 10B, oxide film spacers 46 and 46 are formed on both side wall sides of the gate electrode 44 by forming a second oxide film on the entire SOI substrate and subjecting the second oxide film to anisotropic etching, and finally high-concentration impurity ions are implanted into the SOI layer 3 using the gate electrode 44 and the oxide film spacers 46 and 46 as a mask, forming LDD regions 45a and 45a outside the channel region 49 of the SOI layer 3, and forming a source junction region 47 and a drain junction region 48 outside the LDD regions 45a and 45a.

In the transistor formed on the SOI layer by the above semiconductor device fabricating method, the position of the gate electrode 44 is automatically determined with respect to the positions of the source junction region 47 and the drain junction region 48. Therefore, the desired transistor structure can easily be formed independently of the accuracy of the exposure apparatus. The LDD regions 45a and 45a can be formed with the same thickness as that of the channel region 49 by forming the first nitride film spacers 41 and 41 and the second nitride film spacers 42 and 42, similarly to the second and third embodiments. Therefore, the dispersion in electrical characteristics can be reduced.

Furthermore, in the above transistor, the source junction region 47 and the drain junction region 48 are formed thicker than the channel region 49 and the LDD regions 45a and 45a, and therefore, the resistances of the junction regions themselves are reduced. The source junction region 47 and the drain junction region 48 in the vicinity of the LDD regions 45a and 45a continuously vary in thickness so that the regions become gradually thicker from the LDD regions 45a and 45a side toward the outside, and the gate electrode 44 is separated apart from the source and drain junction regions 47 and 48. Therefore, a capacitance between the gate electrode 44 and the source and drain junction regions 47 and 48 does not increase, scarcely varying the capacitance of the gate electrode 44. Therefore, the reduction in operating speed of the transistor can be restrained.

The side wall of the gate electrode 44 is formed roughly perpendicularly to the SOI substrate and the oxide film spacers 46 and 46 are formed as side walls on both side wall sides of the gate electrode 44. Therefore, the controllability of high-concentration impurity ion implantation into the SOI layer portion where the source and drain regions 47 and 48 are formed is improved and the bridge shortcircuit between the gate electrode 44 and the source and drain regions 47 and 48 in the silicide process can also be prevented.

Although the second through fourth embodiments have been described with reference to the nitride film spacers 21, 32, 41 and 42, a material of an oxynitride film (SiON) or the like may be used for the spacer.

Although the channel region 19, 29, 39, 49 of the SOI layer 3 has a film thickness of 50 nm in the first through fourth embodiments, the film thickness of the channel region of the SOI layer is allowed to be within a range of 5 to 100 nm. The channel region of the SOI layer becomes a completely depleted type when the thickness is 5 to 50 nm to have an improved degree of carrier mobility and becomes a partially depleted type when the thickness is 50 to 100 nm to have a practically sufficient carrier mobility. If the thickness of the channel region is smaller than 5 nm, then the film thickness control is difficult to disadvantageously increase the dispersion in electrical characteristics. If the thickness of the channel region exceeds 100 nm, then a reduction in the degree of carrier mobility emerges as a problem.

Although the source and drain regions 17, 18, 27, 28, 37, 38, 47, 48 of the SOI layer 3 have a film thickness of 150 nm, it is appropriate to make the source and drain junction regions have a thickness greater than that of the channel region and make the source and drain junction regions of the SOI layer have a film thickness within the range of 50 to 500 nm (assuming that the source and drain junction regions have a film thickness of, for example, 50 nm, then the film thickness of the channel region falls within the range of not smaller than 5 nm and smaller than 50 nm). The source junction region and drain junction region of the SOI layer is allowed to have a reduced resistance by setting the thickness to 50 to 500 nm. However, the resistance becomes disadvantageously high when the thickness is smaller than 50 nm. If the source junction region and the drain junction region have a thickness exceeding 500 nm, then much time is required to form the SOI layer, and the reduction in time of the fabricating process cannot easily be achieved.

In the first through fourth embodiments, the insulating layer 2 of the SOI substrate should preferably be either the oxide film or the nitride film. In the above case, a monocrystal thin film can be formed as a SOI layer on the insulating layer that becomes a foundation by using the oxide film or nitride film of the semiconductor material of the SOI layer formed on the insulating layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device fabricating method comprising:
   providing an SOI substrate comprising a substrate comprising silicon, an insulating layer and an SOI layer;
   successively forming, on the SOI substrate, a first oxide film and a nitride film;
   forming an opening in the nitride film;
   selectively oxidizing the SOI layer and forming a selection oxide film on the remaining SOI layer at an area of the opening in the nitride film, wherein the nitride film in which the opening is formed is used as a mask;
   etching the selection oxide film using the nitride film in which the opening is formed as a mask;
   forming a gate oxide film in an area where the selection oxide film was etched;
   forming a gate electrode comprising polysilicon over the gate oxide film at least partially inside the opening of the nitride film by forming a layer comprising polysilicon on the SOI substrate and etching back the layer comprising polysilicon;
   removing at least portions of the nitride film, the selection oxide film and the first oxide film after formation of the gate electrode;
   after said removing of at least portions of the nitride film, the selection oxide film and the first oxide film, forming a portion that becomes an LDD region in the SOI layer by implanting low-concentration impurity ions into the SOI layer using the gate electrode as a mask;
   forming an oxide film spacer on side wall sides of the gate electrode by forming a second oxide film on the SOI substrate and subjecting the second oxide film to anisotropic etching; and
   after implanting the low-concentration impurity ions to form the portion to become the LDD region, forming a source junction region and a drain junction region in the SOI layer by implanting high-concentration impurity ions into the SOI layer using the gate electrode and the oxide film spacer as a mask.

2. A semiconductor device fabricating method comprising:
   providing an SOI substrate comprising a substrate comprising silicon, an insulating layer and an SOI layer;
   successively forming, on the SOI substrate, a first oxide film and a first nitride film;
   forming an opening in the first nitride film by removing a specified region of the first nitride film;
   using the first nitride film as a mask, selectively oxidizing the SOI layer and forming a selection oxide film at an area of the opening in the first nitride film;
   forming a nitride film spacer on side wall sides of the opening of the first nitride film by forming a second nitride film on the SOI substrate and etching back the second nitride film by anisotropic etching until the selection oxide film is exposed;
   etching the selection oxide film using the first nitride film and the nitride film spacer as a mask;
   forming a gate oxide film in an area where the selection oxide film was etched;
   forming a gate electrode comprising polysilicon at least partially inside the opening of the first nitride film by forming a layer comprising polysilicon on the SOI substrate and etching back the layer comprising polysilicon;
   removing at least portions of the first nitride film, the nitride film spacer, the selection oxide film and the first oxide film after the formation of the gate electrode;
   after removing the first nitride film, the nitride film spacer, the selection oxide film and the first oxide film, forming a portion that becomes an LDD region in the SOI layer by implanting low-concentration impurity ions into the SOI layer using the gate electrode as a mask;
   forming an oxide film spacer on side wall sides of the gate electrode by forming a second oxide film on the SOI substrate and subjecting the second oxide film to anisotropic etching; and
   after implanting low-concentration impurity ions to form the portion that becomes the LDD region, forming a source junction region and a drain junction region in the SOI layer by implanting high-concentration impurity ions into the SOI layer using the gate electrode and the oxide film spacer as a mask.

3. A semiconductor device fabricating method comprising:
   providing an SOI substrate comprising a substrate comprising silicon, an insulating layer and an SOI layer;
   successively forming, on the SOI substrate, a first oxide film and a first nitride film;
   forming an opening in the first nitride film by removing a specified region of the first nitride film;
   selectively oxidizing the SOI layer and forming a selection oxide film in an area wherein the specified region of the first nitride film was removed, using the first nitride film as a mask;
   etching the selection oxide film using the first nitride film as a mask;
   forming a second oxide film in an area where the selection oxide film was etched;
   forming a nitride film spacer on side wall sides of the opening of the first nitride film by forming a second nitride film and etching back the second nitride film by anisotropic etching until at least a portion of the second oxide film is exposed;
   removing the exposed region of the second oxide film after the formation of the nitride film spacer and forming a gate oxide film on the SOI layer exposed by the removal of the second oxide film;
   forming a gate electrode comprising polysilicon at least partially inside the opening of the first nitride film by forming a layer comprising polysilicon on the SOI substrate and etching back the layer comprising polysilicon;
   removing at least portions of the first nitride film, the nitride film spacer, the selection oxide film and the first oxide film after the formation of the gate electrode;
   after removing the first nitride film, the nitride film spacer, the selection oxide film and the first oxide film, forming a portion that becomes an LDD region in the SOI layer by implanting low-concentration impurity ions into the SOI layer using the gate electrode as a mask;
   forming an oxide film spacer on side wall sides of the gate electrode by forming a second oxide film on the SOI substrate subjecting the second oxide film to anisotropic etching; and
   after forming the portion that becomes the LDD region by implanting low-concentration impurity ions into the SOI layer, forming a source junction region and a drain junction region in the SOI layer outside the region below the gate electrode and the oxide film spacer by implanting high-concentration impurity ions into the SOI layer using the gate electrode and the oxide film spacer as a mask.

4. A semiconductor device fabricating method comprising:

provding an SOI substrate comprising a silicon substrate, an insulating layer and an SOI layer;

successively forming, on the SOI substrate, a first oxide film and a first nitride film;

forming an opening in the first nitride film by removing a specified region of the first nitride film;

in an area where the first nitride film was removed, selectively oxidizing the SOI layer and forming a selection oxide film using the first nitride film as a mask;

forming a first nitride film spacer on side wall sides of the opening of the first nitride film by forming a second nitride film etching back the second nitride film by anisotropic etching until the selection oxide film is at least partially exposed in an area where the opening was formed in the first nitride film;

etching the selection oxide film until the SOI layer is exposed using the first nitride film and the first nitride film spacer as a mask;

forming a second oxide film;

forming a second nitride film spacer on side wall sides of the first nitride film spacer in the opening of the first nitride film by forming a third nitride film on the SOI substrate after the formation of the second oxide film and etching back the third nitride film by anisotropic etching until the second oxide film is exposed;

removing the exposed region of the second oxide film after the formation of the second nitride film spacer and forming a gate oxide film on the SOI layer exposed by the removal of the second oxide film;

forming a gate electrode comprising polysilicon at least partially inside the opening of the first nitride film by forming a layer comprising polysilicon on the SOI substrate where the gate oxide film is formed and etching back the layer comprising polysilicon;

removing at least portions of the first nitride film, the first nitride film spacer, the second nitride film spacer, the selection oxide film and the first oxide film after the formation of the gate oxide film and thereafter implanting low-concentration impurity ions into the SOI layer using the gate electrode as a mask in order to form a portion(s) that becomes an LDD region in the SOI layer;

forming an oxide film spacer on side wall sides of the gate electrode by forming a second oxide film on the SOI substrate and subjecting the second oxide film to anisotropic etching; and after forming the portion(s) that becomes the LDD region, forming a source junction region and a drain junction region in the SOI layer by implanting high-concentration impurity ions into the SOI layer using the gate electrode and the oxide film spacer as a mask after the formation of the oxide film spacer.

5. A semiconductor device fabricating method as claimed in claim 1, wherein the channel region of the SOI layer has a thickness of 5 to 100 nm, and the source junction region and the drain junction region of the SOI layer have a thickness of 50 to 500 nm.

6. A semiconductor device fabricating method as claimed in claim 2, wherein the channel region of the SOI layer has a thickness of 5 to 100 nm, and the source junction region and is the drain junction region of the SOI layer have a thickness of 50 to 500 nm.

7. A semiconductor device fabricating method as claimed in claim 3, wherein the channel region of the SOI layer has a thickness of 5 to 100 nm, and the source junction region and the drain junction region of the SOI layer have a thickness of 50 to 500 nm.

8. A semiconductor device fabricating method as claimed in claim 4, wherein the channel region of the SOI layer has a thickness of 5 to 100 nm, and the source junction region and the drain junction region of the SOI layer have a thickness of 50 to 500 nm.

9. A semiconductor device fabricating method as claimed in claim 1, wherein the insulating layer of the SOI substrate is either the oxide film or the nitride film.

10. A semiconductor device fabricating method as claimed in claim 2, wherein the insulating layer of the SOI substrate is either the oxide film or the nitride film.

11. A semiconductor device fabricating method as claimed in claim 3, wherein the insulating layer of the SOI substrate is either the oxide film or the nitride film.

12. A semiconductor device fabricating method as claimed in claim 4, wherein the insulating layer of the SOI substrate is either the oxide film or the nitride film.

13. A semiconductor device fabricating method comprising:

providing an SOI substrate comprising a substrate comprising silicon, an insulating layer and an SOI layer;

successively forming, on the SOI substrate, first and second dielectric films;

forming an opening in the second dielectric film;

selectively oxidizing the SOI layer and forming a selection oxide film in an area of the opening of the second dielectric film, using the second dielectric film as a mask;

etching the selection oxide film using the second dielectric film in which the opening is formed as a mask;

forming a gate oxide film in an area where the selection oxide film was etched;

forming a gate electrode over the gate oxide film at least partially inside the opening of the second dielectric film;

removing at least portions of the second dielectric film, the selection oxide film and the first dielectric film after formation of the gate electrode, implanting low-concentration impurity ions into the SOI layer using the gate electrode as a mask in order to form at least one region to be an LDD region;

forming at least one sidewall spacer on the gate electrode; and after implanting the low-concentration impurity ions to form the region to be the LDD region, forming a source region and a drain region in the SOI layer by implanting high-concentration impurity ions into the SOI layer using the gate electrode and the sidewall spacer as a mask.

* * * * *